United States Patent [19]
Matsumoto et al.

[11] Patent Number: 5,625,453
[45] Date of Patent: Apr. 29, 1997

[54] SYSTEM AND METHOD FOR DETECTING THE RELATIVE POSITIONAL DEVIATION BETWEEN DIFFRACTION GRATINGS AND FOR MEASURING THE WIDTH OF A LINE CONSTITUTING A DIFFRACTION GRATING

[75] Inventors: Takahiro Matsumoto, Zama; Yoshiaki Ohtsu; Kenji Saitoh, both of Atsugi; Koichi Sentoku, Samukawamachi, all of Japan

[73] Assignee: Canon Kabushiki Kaisha, Tokyo, Japan

[21] Appl. No.: 328,884

[22] Filed: Oct. 26, 1994

[30] Foreign Application Priority Data

Oct. 26, 1993 [JP] Japan .................................. 5-290025
Dec. 27, 1993 [JP] Japan .................................. 5-348814
Oct. 17, 1994 [JP] Japan .................................. 6-277104

[51] Int. Cl.$^6$ ............................................... G01B 9/02
[52] U.S. Cl. ........................... 356/351; 356/356; 356/363
[58] Field of Search ............................ 356/349, 351, 356/355, 356, 357, 363

[56] References Cited

U.S. PATENT DOCUMENTS

| 3,953,128 | 4/1976 | Holly ................................ 356/349 |
| 4,710,026 | 12/1987 | Magome et al. ................. 356/349 |
| 5,114,236 | 5/1992 | Matsugu et al. . |
| 5,196,711 | 3/1993 | Matsugu et al. . |
| 5,200,800 | 4/1993 | Suda et al. . |
| 5,285,259 | 2/1994 | Saitoh . |
| 5,313,272 | 5/1994 | Nose et al. . |
| 5,333,050 | 7/1994 | Nose et al. . |
| 5,369,486 | 11/1994 | Matsumoto . |
| 5,377,009 | 12/1994 | Kitaoka et al. . |

FOREIGN PATENT DOCUMENTS 2-090006  3/1990  Japan .

Primary Examiner—Samuel A. Turner
Attorney, Agent, or Firm—Fitzpatrick, Cella, & Scinto

[57] ABSTRACT

A deviation detecting system for detecting a relative positional deviation between first and second diffraction gratings, includes a light source, an illuminating device for projecting first and second light beams from the light source, having different directions of polarization, onto the first and second diffraction gratings along different directions, a first signal detecting device for detecting a first interference light signal from the first diffraction grating, being based on a combination of diffraction light of the first light beam and diffraction light of the second light beam, a second signal detecting device for detecting a second interference light signal from the second diffraction grating, being based on a combination of diffraction light of the first light beam and diffraction light of the second light, a first phase difference detecting device for detecting a phase difference between the first and second interference light signals and, a second phase difference detecting device for producing third and fourth interference light signals for correction of a phase error involved in the detected phase difference, and for detecting a phase difference between the third and fourth interference light signals. The phase error is produced by the first and second diffraction gratings which affect the phase in dependence upon the state of polarization of light impinging thereon. Also provided is a determining device for determining the relative positional deviation between the first and second diffraction gratings on the basis of a phase difference as detected by the first and second phase difference detecting device.

24 Claims, 23 Drawing Sheets

PHASE DIFF. $= (\phi_{xa} - \phi_{xb}) + (\phi_a - \phi_b)$
$= \phi\Delta x + (\phi_a + \phi_b)$

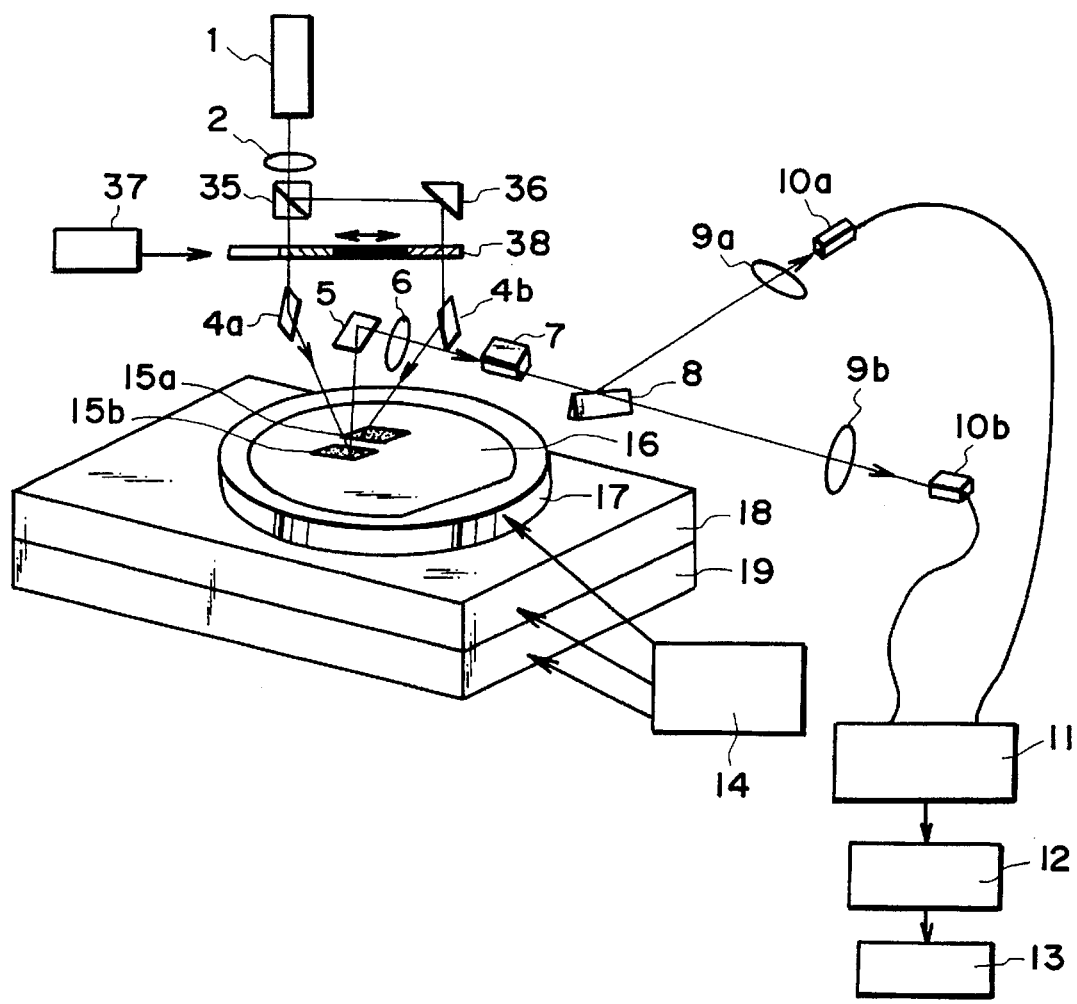
F I G. 12

SYSTEM AND METHOD FOR DETECTING THE RELATIVE POSITIONAL DEVIATION BETWEEN DIFFRACTION GRATINGS AND FOR MEASURING THE WIDTH OF A LINE CONSTITUTING A DIFFRACTION GRATING

FIELD OF THE INVENTION AND RELATED ART

This invention relates generally to a positional deviation detecting method and system. It can be suitably used in a semiconductor device manufacturing exposure apparatus, for example, for transferring and printing fine electronic circuit patterns of different masks (reticles) (first objects) onto a wafer (second object) sequentially, and it can be suitably applied in such exposure apparatus to an alignment system for aligning a mask and a wafer relative to each other or to a measuring device for measuring the registration precision of patterns printed on a wafer after patterns of masks are printed on the wafer.

Conventionally, in semiconductor device manufacturing exposure apparatuses and for projection exposure of a pattern of a mask onto a wafer, relative positional deviation between the mask and the wafer is detected beforehand. Many types of detecting methods have been proposed in relation to the detection of the positional deviation between a mask and a wafer.

As an example, Japanese Laid-Open Patent Application, Laid-Open No. 90006/1990 proposes a method wherein diffraction gratings are used as patterns, and a positional deviation between two diffraction gratings is detected on the basis of the phase difference of two beat signals obtained through independent heterodyne interference of diffraction lights from the two diffraction gratings.

FIG. 1 is a schematic view of a positional deviation detecting system in a semiconductor device manufacturing exposure apparatus of the type disclosed in the aforementioned document.

In FIG. 1, laser light from a two-wavelength crossed polarization laser light source 140 travels to a mirror 141 and it is separated by a polarization beam splitter 142 into two wavelength components (a transverse component and a longitudinal component). They are influenced by an optical system including a mirror 143, cylindrical lenses 144 and 149 and an objective lens 145, and are transformed into elliptical beams 146 and 150 which impinge on a diffraction grating 148 formed on a wafer, held by an X-Y stage 151.

As best shown in FIG. 2, the diffraction grating 148 comprises three diffraction gratings 112, 113 and 114. By these gratings, heterodyne interference combined lights 153–155 are produced in three directions, respectively, along the Z axis. Each of the combined lights 153–155 is divided by a half mirror 156 into two directions, one of which can be observed through an eyepiece 170. The other travels to a prism mirror 157 (158 or 159), a condenser lens 160 (161 or 162), and a polarization plate 163 (164 or 165), and it is received by a photodetector 166 (167 or 168). Thus, optical heterodyne interference beat signals HY1, HY2 and HY3 are produced at the photodetectors 166–168, and these signals are applied to a signal processing means 169. From the change in phase differences of these three signals HY1–HY3, the quantity of the positional deviation between printed patterns on the wafer 147 surface, printed by first and second exposures can be determined.

FIG. 2 shows the diffraction gratings provided on this wafer. As illustrated, diffraction gratings 112 and 113 are printed through the N-th exposure process and, then, a diffraction grating 114 is printed through the (N+1)-th exposure process. The rotational component with respect to a reference of the optical system is detected by using diffraction light from the diffraction gratings 112 and 113, and actual positional deviation between the diffraction gratings is detected on the basis of the diffraction light produced by the diffraction gratings 113 and 114.

Also, for measurement of the linewidth of a printed pattern, a measuring SEM or a laser microscope is used conventionally.

In the positional deviation detecting system shown in FIG. 1, there is a problem that if the shape or material of the diffraction gratings (positional deviation detecting marks) 113 and 114 changes, the phase difference of two beat signals (optical heterodyne interference beat signals), i.e., the positional deviation detection signals, changes correspondingly. In order to solve this problem, it may be contemplated to create an offset for each semiconductor device manufacturing process. However, since the phase difference signal is susceptible to the shape of the diffraction grating, in some cases there occurs an error that can not be corrected by an offset, thus degrading the measurement reproducibility precision as a result.

The inventors of the subject application have found that: the cause of the change in the phase of a beat signal due to the material or shape of a diffraction grating, is that the quantity of the phase change at the time of diffraction by a diffraction grating differs between P-polarized light and S-polarized light, and that this quantity changes with the material or shape of the diffraction grating.

This will be explained in detail, in conjunction with FIGS. 3A and 3B. In FIGS. 3A and 3B, denoted at 110 and 111 are input light, denoted at 113 and 114 are diffraction gratings, and denoted at 115 and 116 are diffraction gratings.

If two light beams, i.e., P-polarized light 110 of a frequency f1 and S-polarized light 110 of a frequency f2, are incident on the diffraction gratings 113 and 114, and resultant diffraction light 115 and 116 from the diffraction gratings 113 and 114 are combined to cause interference, then changes of "$\phi xa+\phi a$" and "$\phi xb+\phi b$" are added to the phases of the heterodyne beat signals.

Here, $\phi xa$ and $\phi xb$ are phase changes resulting from a positional deviation of the diffraction gratings 113 and 114 from respective reference positions, and $\phi a$ and $\phi b$ are phase changes determined by the material and/or shape of the diffraction gratings 113 and 114 (i.e., the difference between the phase of the P-polarized light and the phase of the S-polarized light). They are the terms not dependent on the positional change of the diffraction grating. Here, the phase difference $\Delta\phi$ between the two beat signals can be written as follows:

$$\Delta\phi = (\phi xa - \phi xb) + (\phi a - \phi b) \qquad (1)$$
$$= \phi\Delta x + (\phi a - \phi b)$$

where $\phi\Delta x$ is the quantity of phase change resulting from the relative positional deviation in the X direction between the diffraction gratings 113 and 114.

As suggested in equation (1), other than the phase change quantity $\phi\Delta x$ to be detected, a detection error ($\phi a-\phi b$) is added, such that the phase changes $\phi a$ and $\phi b$ shift in ($\phi a-\phi b$) with the material and/or shape of the two diffraction gratings. Thus, the reproducibility is degraded.

Also, in the measurement of the linewidth of printed pattern, a measuring SEM is expensive. In a case of a resist pattern, for measurement it is necessary to provide an electrically conductive film (e.g. gold) by evaporation beforehand to prevent charge-up. This requires a complicated structure and makes it difficult to execute non-destructive measurement. On the other hand, with a laser microscope, it is not easy to obtain sufficient measurement precision.

SUMMARY OF THE INVENTION

It is accordingly an object of the present invention to provide an improved positional deviation detecting method or system by which a detection error resulting from a change in material or shape of a diffraction grating can be avoided or compensated for, to thereby assure high-precision measurement of positional deviation not affected by a process of semiconductor device manufacture.

In order to achieve this object, according to an aspect of the present invention, a measuring means or a correcting means may be provided to compensate for or cancel a phase change resulting from a change in the material or the shape of a diffraction grating.

It is another object of the present invention to provide an improved linewidth measuring system of simple and inexpensive structure, for measuring the linewidth of a pattern on the basis of a phase change resulting from a change in the material or the shape of a diffraction grating.

In accordance with a first aspect of the present invention, there is provided a deviation detecting system for detecting a relative positional deviation between first and second diffraction gratings, comprising: a light source; illuminating means for projecting first and second light beam from the light source, having different directions of polarization, onto the first and second diffraction gratings along different directions; first signal detecting means for detecting a first interference light signal from the first diffraction grating, being based on a combination of diffraction light beam of the first light beam and diffraction light of the second light beam; second signal detecting means for detecting a second interference light signal from the second diffraction grating, being based on a combination of diffraction light of the first light beam and diffraction light of the second light beam; first phase difference detecting means for detecting a phase difference between the first and second interference light signals; second phase difference detecting means for producing third and fourth interference light signals for correction of a phase error involved in the detected phase difference, and for detecting a phase difference between the third and fourth interference light signals, wherein the phase error being produced by the first and second diffraction gratings which differ with respect to the application of phase to light in dependence upon the state of polarization of light impinging thereon; and determining means for determining the relative positional deviation between the first and second diffraction gratings on the basis of the phase difference as detected by the first and second phase difference detecting means.

In one preferred form of the present invention light beams, the first and second lights have wavelengths different from each other.

In one preferred form of the present invention, the first and second diffraction gratings are provided on a substrate, and the substrate is rotated by 180 degrees relative to the illuminating means and then the illuminating means projects the first and second light beam upon the substrate such that diffraction light of the first light beam and diffraction light of the second light beam, both from the first diffraction grating, are combined with each other to produce the third interference light signal, while diffraction light of the first light beam and diffraction light of the second light beam, both from the second diffraction grating, are combined with each other to produce the fourth interference light signal.

In one preferred form of the present invention, the illuminating means includes polarization reversing means for mutually reversing the directions of polarization of the first and second light beam to provide third and fourth light beam, respectively, and wherein the third and fourth light beam are projected on the first and second diffraction gratings such that diffraction light of the third light beam and diffraction light of the fourth light beam both from the first diffraction grating are combined with each other to produce the third interference light signal, while diffraction light of the third light beam and diffraction light of the fourth light beam both from the second diffraction grating are combined with each other to produce the fourth interference light signal.

In one preferred form of the present invention, the polarization reversing means reverses the polarization in a time series.

In one preferred form of the present invention, the polarization reversing means includes a polarization modulation laser.

In one preferred form of the present invention, the first signal detecting means detects the third interference light signal, while the second signal detecting means detects the fourth interference light signal.

In one preferred form of the present invention, the determining means includes adding means for adding the phase differences to each other as detected by said first and second phase difference detecting means.

In one preferred form of the present invention, the illuminating means includes interchanging means for interchanging the first and second light beams with one another to provide third and fourth light beams, respectively, and wherein the illuminating means projects the third and fourth light beams upon the first and second diffraction gratings such that diffraction light of the third light beam and diffraction light of the fourth light beam, both from the first diffraction rating, are combined with each other to produce the third interference light signal, while diffraction light of the third light beam and diffraction light of the fourth light beam, both from the second diffraction grating, are combined with each other to produce the fourth interference light signal.

In one preferred form of the present invention, the system further comprises light projecting means for projecting a third light beam having the same direction of polarization as the first light beam and a fourth light beam having the same direction of polarization as the second light beam, upon the first and second diffraction gratings along the same direction, wherein the diffraction light of the third light beam and diffraction light of the fourth light beam both from the first diffraction grating are combined with each other to produce the third interference light signal, while diffraction light of the third light beam and diffraction light of the fourth light beam both from the second diffraction grating are combined with each other to produce the fourth interference light signal.

In accordance with a second aspect of the present invention, there is provided a measuring system for measuring the width of a line constituting a diffraction grating, comprising: a light source; illuminating means for projecting first and second light beams from the light source, having different directions of polarization, onto the diffraction grating along different directions; signal detecting means for detecting an interference light signal from the diffraction grating, being based on a combination of diffraction light of the first light beam and diffraction light of the second light beam; reference signal producing means for producing a reference signal; phase difference detecting means for detecting a phase difference between the interference light signal and the reference signal; and determining means for determining the width of the line of the diffraction grating on the basis of the phase difference detected by the phase difference detecting means.

In one preferred form of the present invention the reference signal producing means includes signal detecting means for detecting an interference light signal produced on the basis of a combination of the first and second light beams.

In one preferred form of the present invention the relationship between the phase difference and the linewidth may be detected.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 12 is a schematic view of a main portion of a positional deviation detecting system according to a fourth embodiment of the present invention.

DESCRIPTION OF THE PREFERRED EMBODIMENTS

Figure 1:
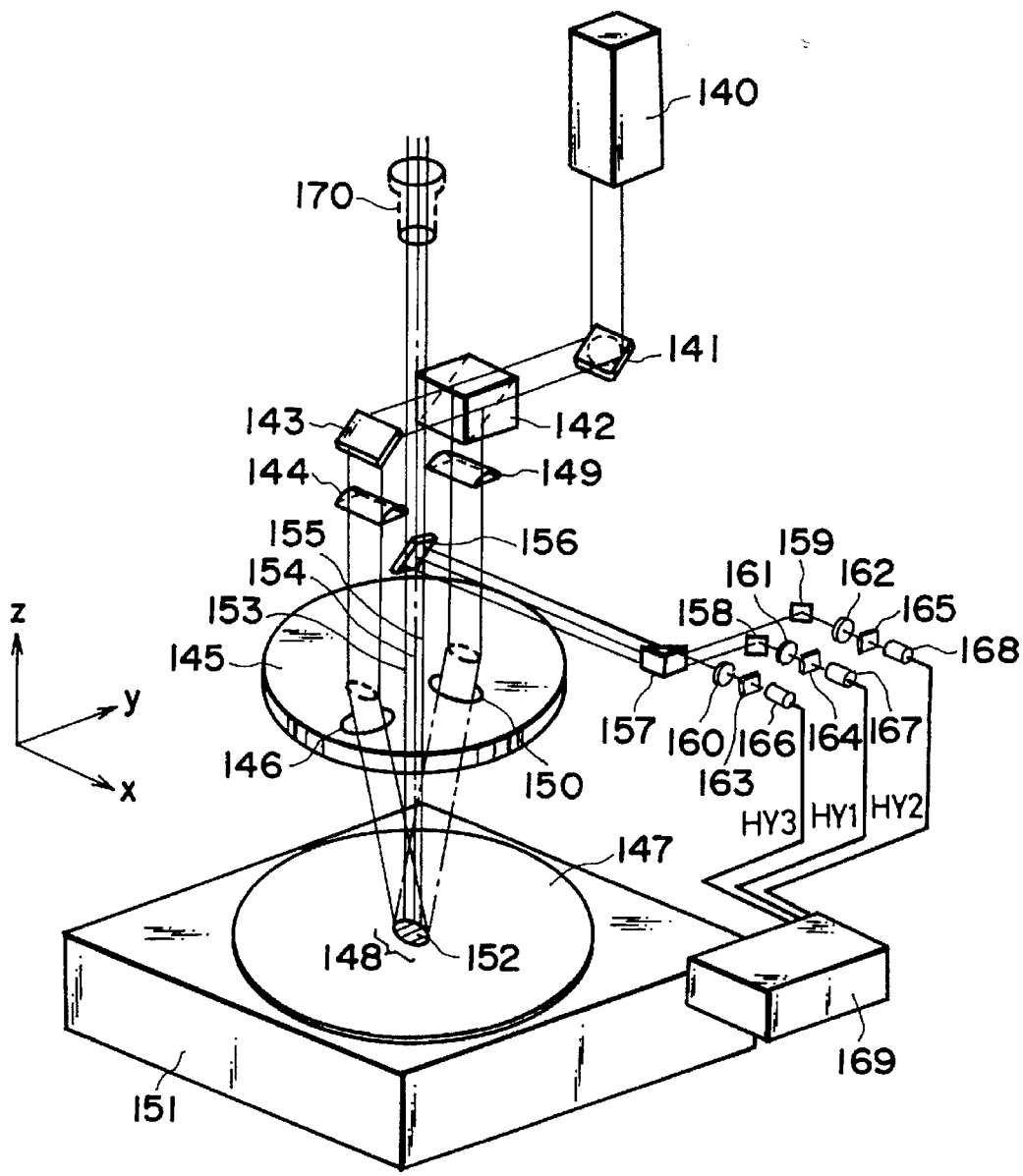
FIG. 1 is a schematic view of a positional deviation detecting system of a known example.
Figure 2:
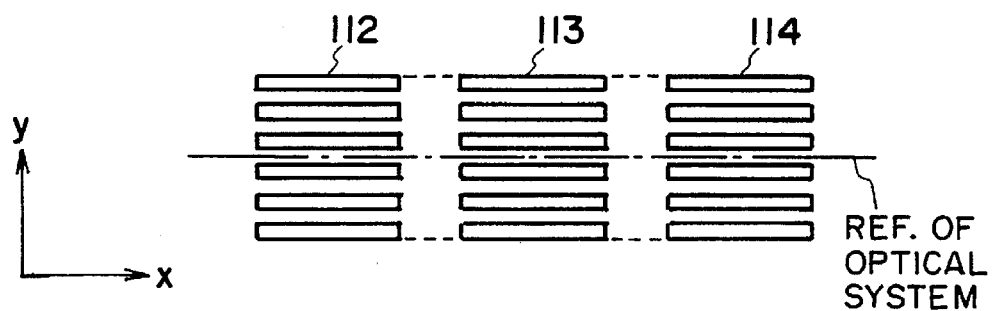
FIG. 2 is an enlarged view of a portion of FIG. 1.
Figure 3A:
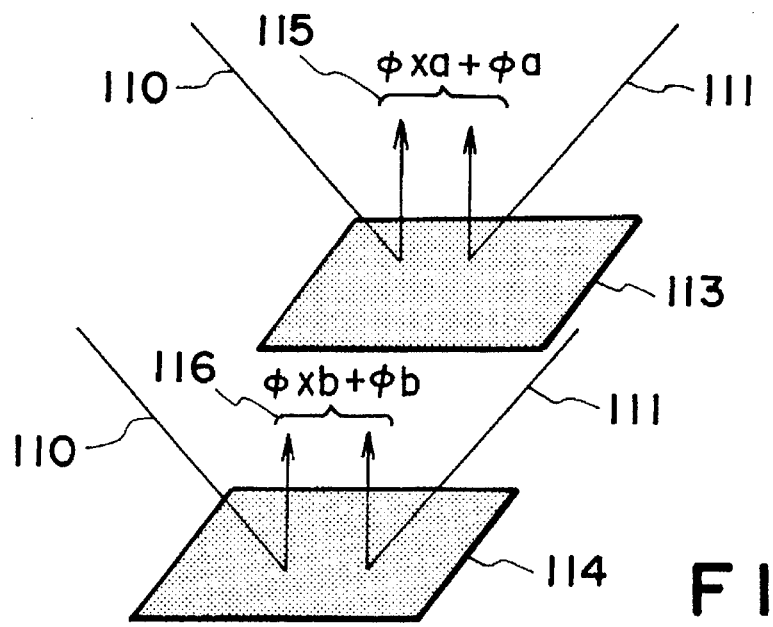
FIGS. 3A and 3B are enlarged views, respectively, of portions of FIG. 1.
Figure 3B:
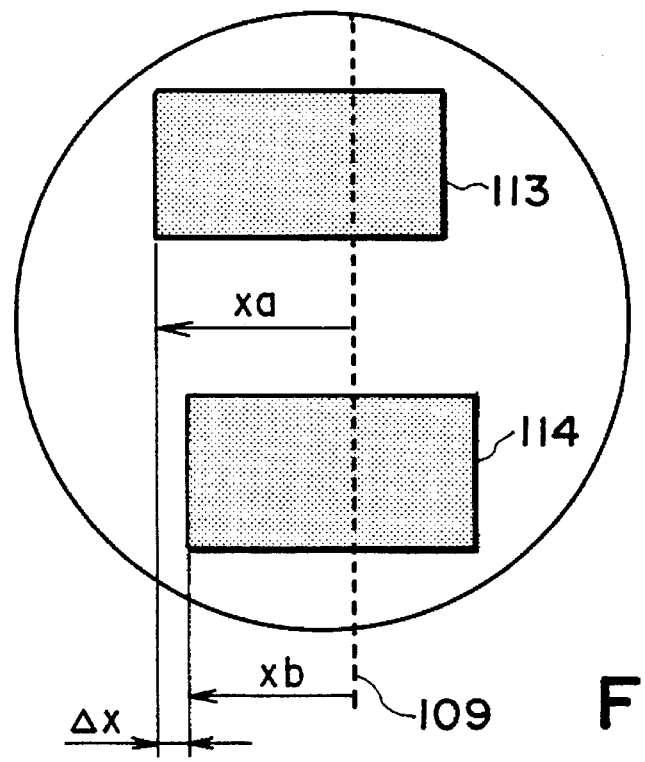
Figure 4:
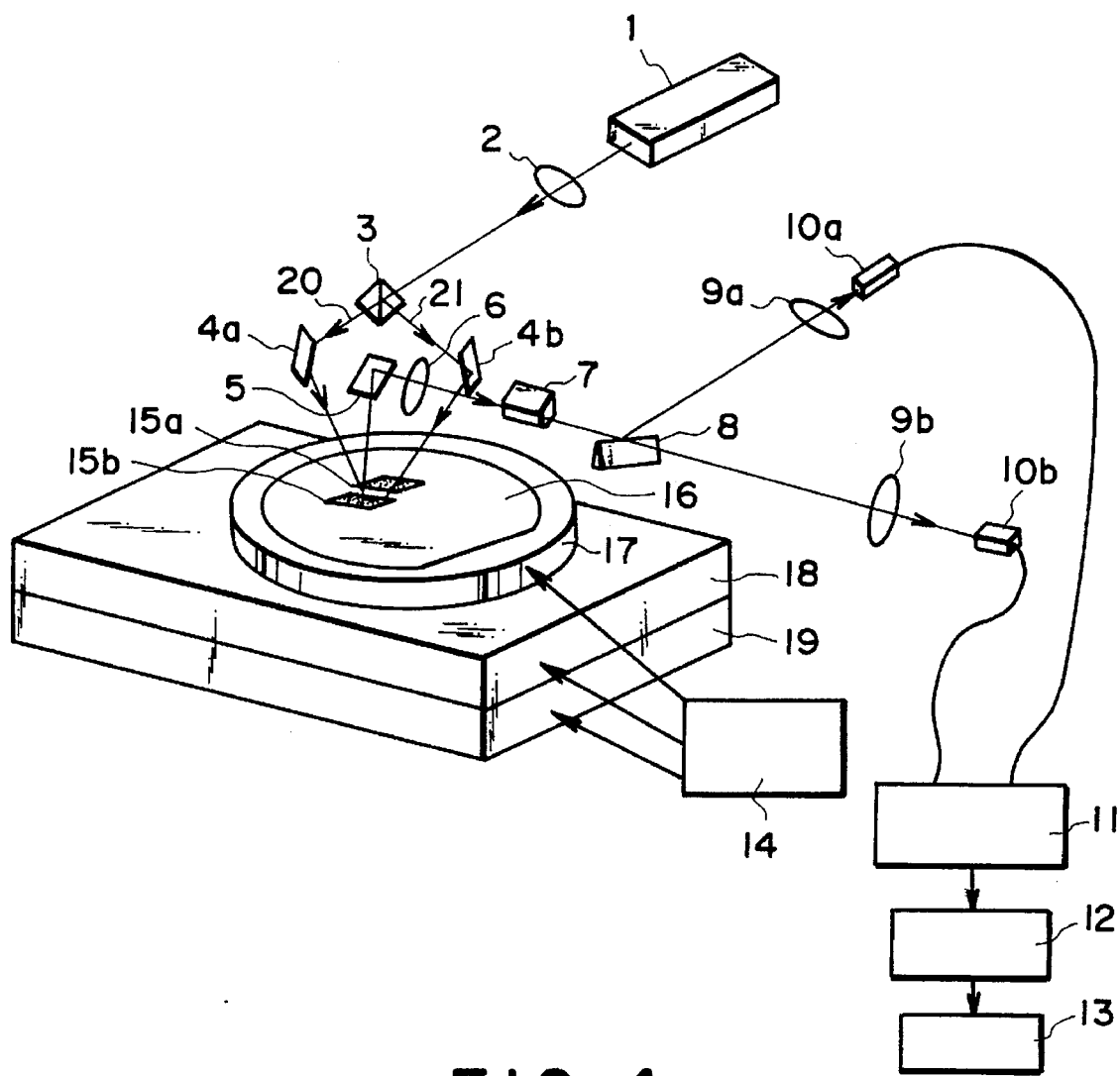
FIG. 4 is a schematic view of a main portion of a positional deviation detecting system according to a first embodiment of the present invention.

FIG. 4 is a schematic view of a main portion of a first embodiment of the present invention. In this embodiment, the invention is applied to a registration precision measuring system for measuring the precision of registration of patterns of two layers in semiconductor device manufacturing processes.

Figure 5:
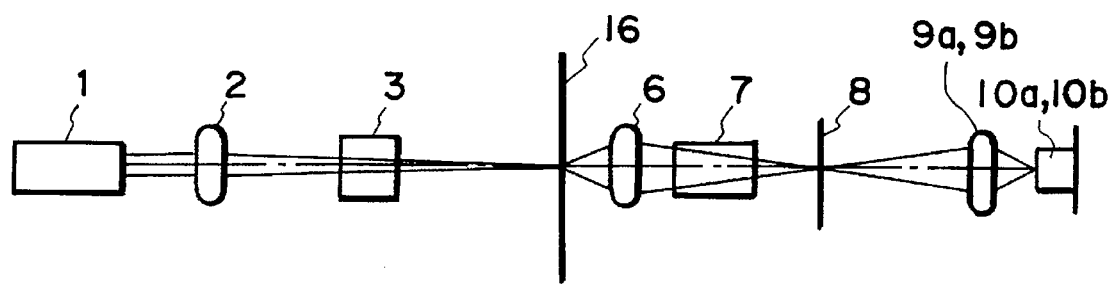
FIG. 5 is a schematic view of optical path of FIG. 4, being illustrated in development.
Figure 6:
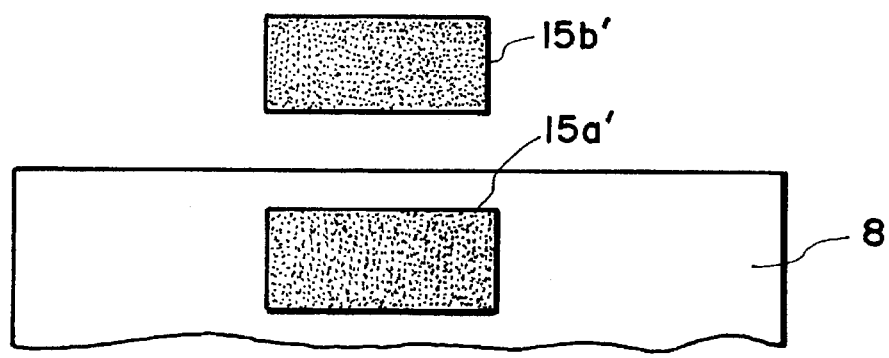
FIG. 6 is an enlarged view of a portion of FIG. 4.
Figure 20:
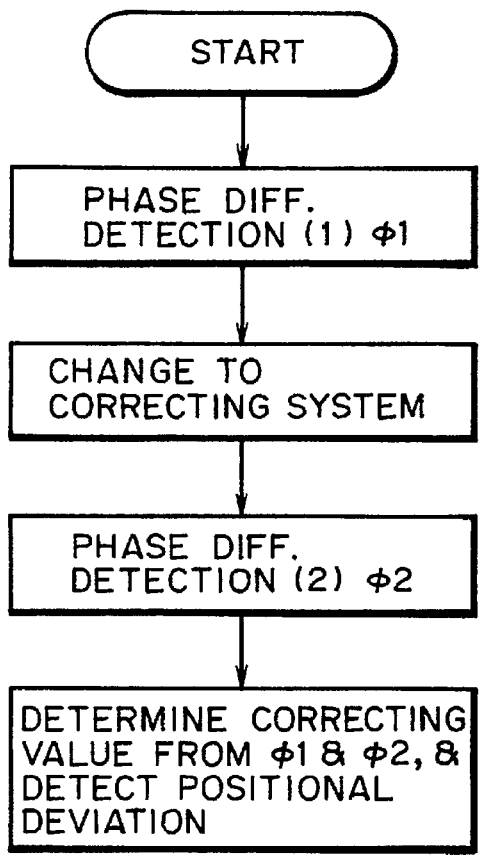
FIG. 20 is a flow chart of the operation of the first embodiment of the present invention.

FIG. 5 is a schematic view, showing optical paths in development. FIGS. 6 and 7 are enlarged views, respectively, of portions of FIG. 4, and FIG. 20 is a flow chart of measurement sequence of this embodiment.

In the drawings, denoted at 1 is a two-frequency crossing polarization laser (light source), and it emits P-polarized light of a frequency f1 and S-polarized light of a frequency f2, for example. Denoted at 2 is a collimator lens for transforming light from the light source 1 into parallel light. Denoted at 3 is a polarization beam splitter, and denoted at 4a and 4b are mirrors. Denoted at 15a is a diffraction pattern having been formed on a wafer 16 through an N-th semiconductor exposure process, and denoted at 15b is a diffraction pattern having been formed on the wafer 16 through an (N+1)-th exposure process.

Denoted at 5 is a mirror, denoted at 6 is a lens, denoted at 7 is a Glan-Thompson prism, and denoted at 8 is an edge prism for dividing and reflecting light into and along two directions. Denoted at 9a and 9b are lenses, and denoted at 10a and 10b are sensors. Denoted at 11 is a phase difference meter for detecting a phase difference between signals from the sensors 10a and 10b. Denoted at 12 is a memory means, denoted at 13 is a computing element, denoted at 14 is a stage controlling system, and denoted at 17 is a rotatable stage for carrying a wafer 16 thereon. Denoted at 18 is a Y stage, and denoted at 19 is an X stage, these stages being movable along Y and X axes, respectively.

The operation of this embodiment will be explained below.

Light beam 20 of P-polarization, having a frequency f1 and emitted from the two-frequency crossing polarization laser 1, passes the lens 2 and the polarization beam splitter 3. Then, it is deflected by the mirror 4a, and it impinges on the diffraction gratings 15a and 15b on the wafer 16. Here, the mirror 4a is so set that positive first order diffraction light from the diffraction gratings 15a and 15b are diffracted perpendicularly with respect to the wafer 16.

On the other hand, light beam 21 of S-polarization having a frequency f2 and being emitted from the laser 1, goes through the collimator lens 2 and is reflected by the polarization beam splitter 3. Then, it is deflected by the mirror 4b, and it is projected on the diffraction gratings 15a and 15b. Here, the mirror 4a is so set that negative first order diffraction light from the diffraction gratings 15a and 15b are diffracted perpendicularly with respect to the wafer 16.

The collimator lens 2 serves to restrict the beam projected, so that, upon the wafer 16, the beam forms a spot (spot 23 in FIG. 7) slightly larger than the two diffraction gratings 15a and 15b.

Here, after being divided into light beams 20 and 21 of two different frequencies by means of the polarization beam splitters 3, these beams are recombined upon the diffraction gratings 15a and 15b so that they advances along the same path. This combined diffraction light is deflected by the mirror 5, and it passes the lens 6 and impinges on the Glan-Thompson prism 7. This prism serves to make the directions of polarization of the light registered, such that heterodyne interference of them occurs.

As shown in FIG. 5, the edge mirror 8 is disposed in an optically conjugate relation with the wafer 16 with respect to the lens 6. Namely, as shown in FIG. 6, images 15a' and 15b' of the diffraction gratings 15a and 15b can be seen on the edge mirror 8. In the manner described, combined heterodyne interference light from the diffraction grating 15a and combined heterodyne interference light from the diffraction grating 15b are bisected, through transmission of one of them through the edge mirror 8 and through reflection of the other by the edge mirror 8.

Diffraction light from the diffraction grating 15a being reflected by the edge mirror 8, goes through the lens 9a and it is photoelectrically converted by the sensor 10a. Thus, a first beat signal is produced. Also, the diffraction light from the diffraction grating 15b being transmitted through the edge mirror 8, goes through the lens 9b and it is photoelectrically converted by the sensor 10b. Thus, a second beat signal is produced.

As shown in FIG. 5, the lenses 9a and 9b serve to bring the wafer 16, the edge mirror 8 and the sensors 10a and 10b into an optically conjugate relation with each other. The imaging magnification of the lens 6 and the lens 9a (9b) is so set that the image of diffraction grating can be projected within the range of light receiving surface of the sensor 10a (10b). The phase difference meter 11 detects a phase difference DT1 between the two heterodyne beat signals produced by the sensors 10a and 10b, and it is stored into the temporary storage means 12 (first phase difference detecting step).

After this, the rotational stage 17 is rotated by 180 degrees and the X and Y stages 19 and 18 are driven so that the diffraction gratings 15a and 15b are moved into alignment with the beam spot position. In the same manner as described, third and fourth beat signals are then produced, and a phase difference DT2 of them is detected. It is stored into the temporary storage means 12 (second phase difference detecting step).

On the basis of the detected phase differences DT1 and DT2, the computing element 13 then serves to detect the relative positional deviation between the diffraction gratings 15a and 15b. Now, the phase of diffraction light or the phase of the beat signal will be explained in conjunction with FIGS. 7A and 7B.

Figure 7A:
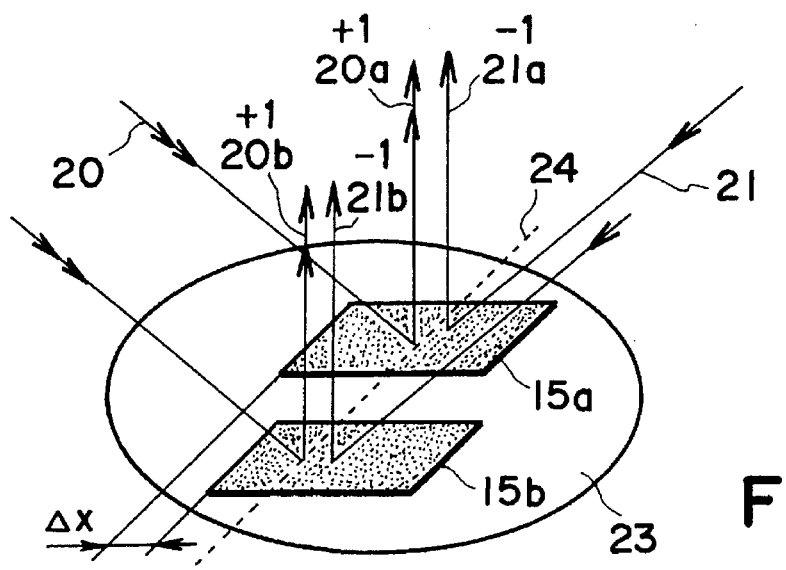
FIGS. 7A and 7B are enlarged views, respectively, of portions of FIG. 4.
Figure 7B:
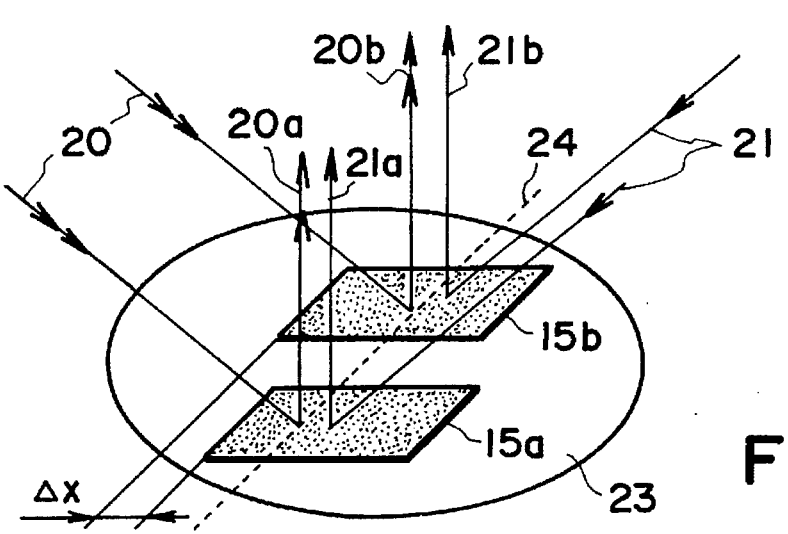

In FIG. 7A, the complex amplitude representation u1a of positive first order diffraction light 20a, from the diffraction grating 15a, of the light beam 20 of P-polarization having a frequency f1 (angular frequency w1), can be written as follows:

$$u1a = u0 \exp\{w1 \cdot t + \phi xa + \phi ap\} \quad (2)$$

where u0 is the amplitude of the light 20, and $\phi a$ is the phase change resulting from positional deviation xa in the X direction of the diffraction grating 15a from the reference line 24 of the optical system. If the pitch of the diffraction grating 15a is denoted by p, it is expressed by $\phi xa = 2\pi xa/p$. Also, $\phi ap$ is the phase change which is caused in the P-polarized light by diffraction, it being determined by the material and shape of the diffraction grating 15a.

On the other hand, the complex amplitude representation u2a of negative first order diffraction light 21a, from the diffraction grating 15a, of the light beam 21 of S-polarizaton having a frequency f2 (angular frequency w2), can be written as follows:

$$u2a = u0 \exp\{w2 \cdot t - \phi xa + \phi as\} \quad (3)$$

where $\phi ax$ is the phase change caused in the S-polarized light by diffraction, it being determined by the material and shape of the diffraction grating 15a.

The complex amplitude representation u1b of positive first order diffraction light 20b, from the diffraction grating 15b, of the light 20 of P-polarization having a frequency f1 (angular frequency w1), can be written as follows:

$$u1b = u0 \exp\{w1 \cdot t + \phi xb + \phi bp\} \quad (4)$$

where u0 is the amplitude of the light 20, $\phi xb$ is the phase change resulting from the positional deviation xb in the X direction of the diffraction grating 15b from the reference line 24 of the optical system. If the pitch of the diffraction grating 15b is denoted by p, it can be expressed by $\phi xb = 2\pi xb/p$. Also, $\phi bp$ is the phase change caused in the P-polarized light by diffraction, it being determined by the material and shape of the diffraction grating 15b.

On the other hand, the complex amplitude representation u2b of negative first order diffraction light 21b, from the diffraction grating 15b, of the light beam 21 of S-polarization having a frequency f2 (angular frequency w2), can be written as follows:

$$u2b = u0 \exp\{w2 \cdot t - \phi xb + \phi bs\} \quad (5)$$

where $\phi bs$ is the phase change caused in the S-polarized light by diffraction, it being determined by the material and shape of the diffraction grating 15b.

Here, the alternating component Ia of the beat signal (first beat signal) produced at the sensor 10a as a result of heterodyne interference of the diffraction light beams 20a and 21a, can be expressed as follows while taking the amplitude as IO:

$$Ia = IO \cos\{(w1-w2)t + 2\phi xa + (\phi ap - \phi as)\} \quad (6)$$

Also, the alternating component Ib of the beat signal (second beat signal) produced at the sensor 10b is a result of heterodyne interference of the diffraction light beams 20b and 21b, can be expressed as follows:

$$Ib = I0 \cos\{(w1-w2)t + 2\phi xb + (\phi bp - \phi bs)\} \quad (7)$$

The phase difference $\Delta\phi 1$ between the first and second beat signals represented by equations (6) and (7) is:

$$\begin{aligned}\Delta\phi 1 &= 2(\phi xa - \phi xb) + \{(\phi ap - \phi as) - (\phi bp - \phi bs)\} \quad (8)\\ &= 2\phi\Delta x + \{(\phi ap - \phi as) - (\phi bp - \phi bs)\}\end{aligned}$$

where $\phi\Delta x$ is the phase change resulting from the relative positional deviation $\phi\Delta x$ between the diffraction gratings 15a and 15b in the X direction, it being expressed as:

$$\phi\Delta x = 4\pi\Delta x/p \quad (9)$$

On the other hand, if the deviation of the diffraction grating 15a in the X direction from the reference line 24 of the optical system is denoted by xa', then the interference beat signal (third beat signal) Ia' of the diffraction light beams 20a and 21a, produced at the sensor 10b in response to rotation of the wafer 16 through 180 degrees (FIG. 7B), can be written as follows:

$$Ia' = I0 \cos\{(w1-w2)t + 2\phi xa' + (\phi ap - \phi as)\} \quad (10)$$

Also, if the deviation of the diffraction grating 15b in the X direction from the reference line 24 of the optical system is denoted by xb', then the interference beat signal (fourth beat signal) Ib' of the diffraction light beams 20b and 21b, produced at the sensor 10a in response to rotation of the wafer 16 through 180 degrees (FIG. 7B), can be written as follows:

$$Ib' = I0 \cos\{(w1-w2)t + 2\phi xb' + (\phi bp - \phi bs)\} \quad (11)$$

Here, from equation (11), the phase difference $\Delta\phi 2$ between the third and fourth beat signals can be taken as in equation (12) below:

$$\begin{aligned}\Delta\phi 2 &= 2(\phi xb' - \phi xa') - \{(\phi ap - \phi as) + (\phi bp - \phi bs)\} \quad (12)\\ &= 2\phi\Delta x - \{(\phi ap - \phi as) - (\phi bp - \phi bs)\}\end{aligned}$$

Taking the sum $\Delta\phi$ of the phase differences $\Delta\phi 1$ and $\Delta\phi 2$ represented by equations (8) and (12) by means of the computing element 13, the term of the error (sandwiched between symbols "{"and"}") resulting from the shape and material of the diffraction grating, is canceled and the following is obtained:

$$\begin{aligned}\Delta\phi &= \Delta\phi 1 + \Delta\phi 2 \quad (13)\\ &= 4\phi\Delta x\\ &= 8\pi\Delta x/p\end{aligned}$$

Thus, the relative positional deviation $\Delta x$ between the diffraction gratings 15a and 15b, that is, the positional deviation between a circuit pattern printed through the N-th exposure process and a circuit pattern printed through the (N+1)-th exposure process, can be determined in accordance with the following equation:

$$\Delta x = \Delta\phi \cdot P/(8\pi) \quad (14)$$

As regards the error due to any rotational component of the mark with respect to the detection optical system, for example it can be canceled such that: an additional reference mark consisting of two diffraction gratings having no deviation may be printed on a wafer the same time as the diffraction grating 15a, for example, is printed; before and after rotation of the wafer through 180 degrees, phase difference signals from that mark are detected, respectively; thus the error resulting from the rotational component as well as the offset value of the optical system can be removed by using the detected as the correction value.

While the present embodiment has been described in connection with the X direction, the above-described procedure can be applied also to the Y direction: additional diffraction ratings for detection of Y-axis direction deviation may be printed and an additional optical system for detection of the Y-axis direction deviation may be provided; or alternatively, the rotatable stage may be rotated by 90 degrees from the position shown in FIG. 4 and phase difference detection may be performed and, subsequently, it may be further rotated by 180 degrees from that position and phase difference detection may be performed, such that, on the basis of two signals thus obtained, any positional deviation $\Delta y$ in the Y direction may be measured.

Figure 8:
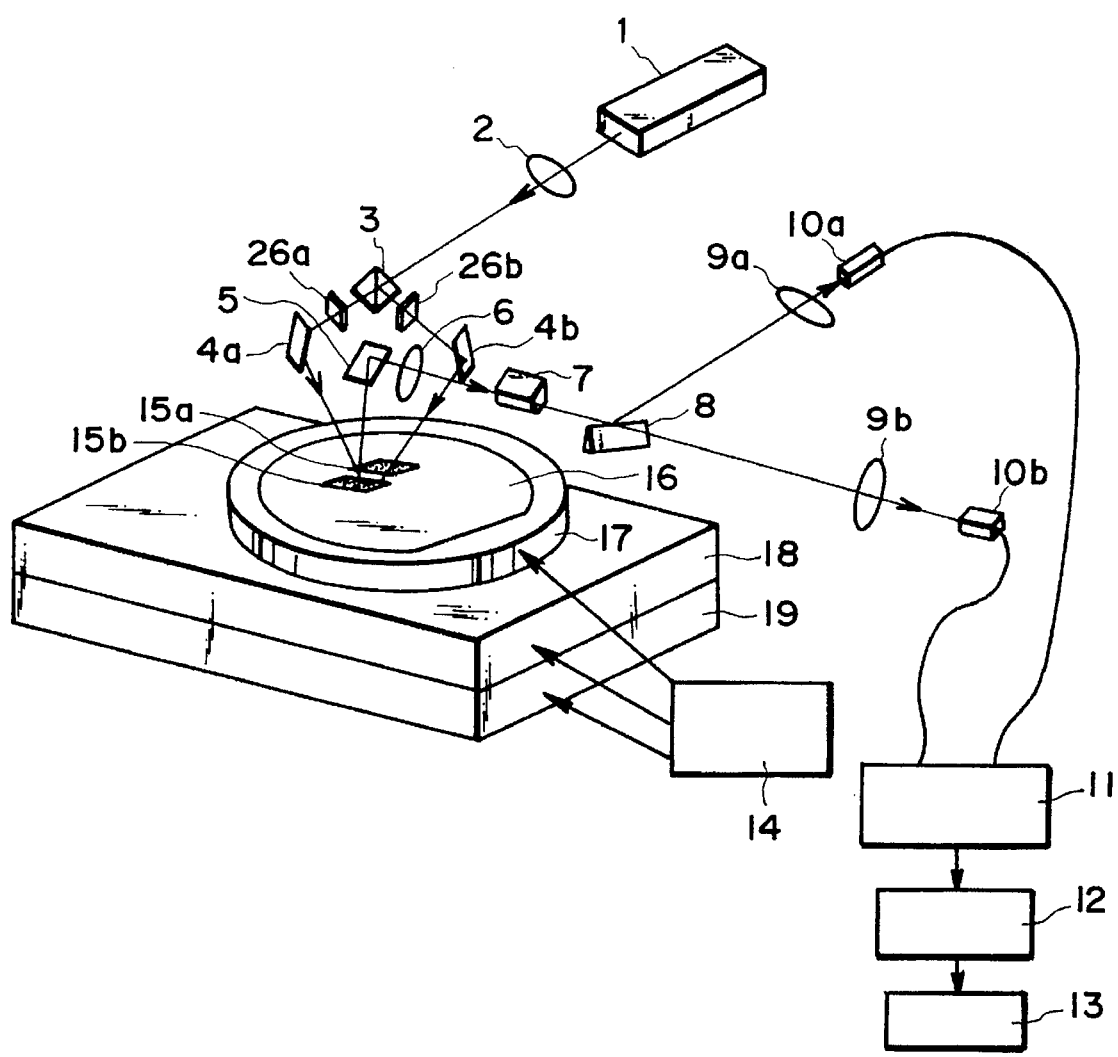
FIG. 8 is a schematic view of a main portion of a positional deviation detecting system according to a second embodiment of the present invention.
Figure 9A:
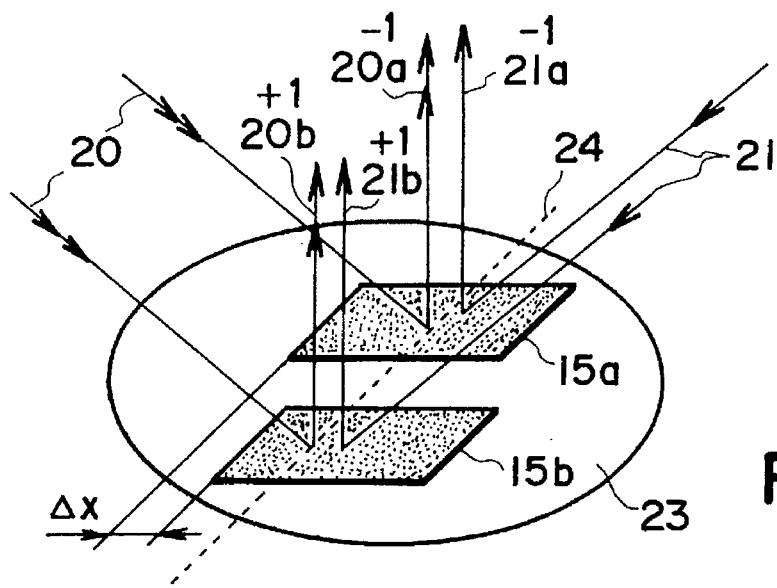
FIGS. 9A and 9B are enlarged views, respectively, of portions of FIG. 8.
Figure 9B:
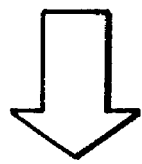
Figure 9B:
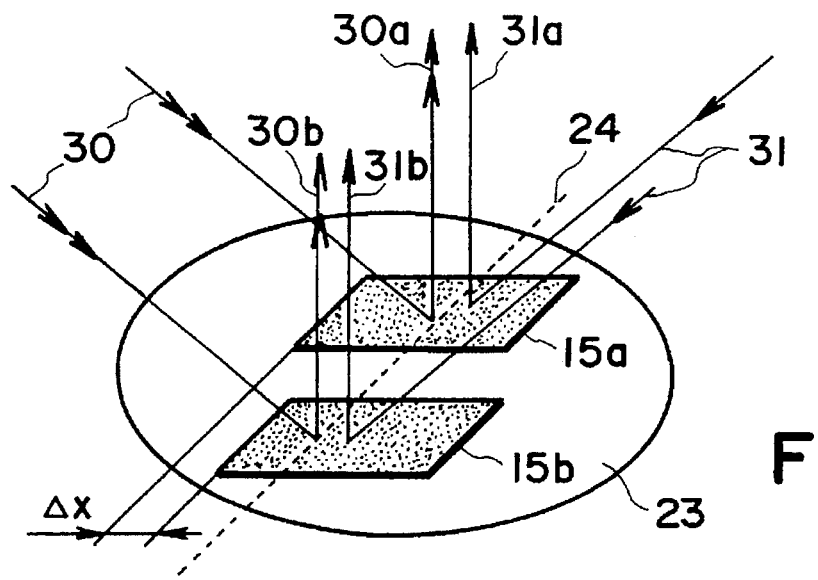

FIG. 8 is a schematic view of a main portion of a second embodiment of the present invention. FIG. 9 is an enlarged view of a portion of FIG. 8. As compared with the first embodiment of FIG. 4, this embodiment differs therefrom in that a polarization changing means 26a (26b) is provided between a polarization beam splitter 3 and a mirror 4a (4b). The remaining portion is of the same structure.

In FIG. 8, light 20 of P-polarization and having a frequency f1, emitted by a two-frequency crossing polarization laser 1, goes through a collimator lens 2 and a polarization beam splitter 3. After this, it passes the polarization changing means 26a and then it is deflected by the mirror 4a to irradiate diffraction gratings 15a and 15b on a wafer 16. Here, the mirror 4a is so set that positive first order diffraction light from the diffraction gratings 15a and 15b are diffracted perpendicularly with respect to the wafer 16.

On the other hand, light 21 of S-polarization and having a frequency f2, omitted by the laser 1, goes through the collimator lens 2 and it is reflected by the polarization beam splitter 3. After this, it passes polarization changing means 26b and then it is deflected by the mirror 4b to irradiate diffraction gratings 15a and 15b on a wafer 16. Here, the mirror 4b is so set that positive first order diffraction light from the diffraction gratings 15a and 15b are diffracted perpendicularly with respect to the wafer 16.

The polarization changing means 26a and 26b can be on/off controlled by means of a switching device (not shown). In the ON position, light of P-polarization incident on the polarization changing means 26a is influenced thereby so that the direction of polarization is changed by 90 degrees such that it emanates as light of S-polarization. Also, light of S-polarization incident on the polarization changing means 26b is influenced thereby so that the direction of polarization is change by 90 degrees such that it emanates as P-polarized light.

In the OFF position, on the other hand, the direction of polarization is unchanged. The polarization changing means may be provided by a waveplate, for example.

Now, the measuring method in accordance with this embodiment will be explained in conjunction with FIGS. 9A and 9B.

When both of the polarization changing means 26a and 26b are in their OFF positions, the complex amplitude representation u1a of positive first order diffraction light 20a, from the diffraction grating 15a, of the light beam 20 of P-polarization having a frequency f1 (angular frequency w1) can be written as follows:

$$u1a = u0\exp\{w1 \cdot t + \phi xa + \phi ap\} \quad (15)$$

where u0 is the amplitude of the light beam 20, and $\phi xa$ is the phase change resulting from a positional deviation xa of the diffraction grating 15a in the X direction from the reference line 24 of the optical system. If the pitch of the diffraction rating 15a is denoted by p, it can be expressed that φxa=2πxa/p. Also, φap is the phase difference caused in the P-polarized light by diffraction, it being determined by the material and shape of the diffraction rating 15a.

On the other hand, the complex amplitude representation u2a of negative first order diffraction light 21a, from the diffraction grating 15a, of the light beam 21 of S-polarization having a frequency f2 (angular frequency w2) can be written as follows:

$$u2a = u0\exp\{w2 \cdot t + \phi xa + \phi as\} \tag{16}$$

where φas is the phase difference caused in the S-polarized light by diffraction, it being determined by the material and shape of the diffraction grating 15a.

Also, the complex amplitude representation u1b of positive first order diffraction light 20b, from the diffraction grating 15b, of the light beam 20 of P-polarization having a frequency f1 (angular frequency w1) can be written as follows:

$$u1b = u0\exp\{w1 \cdot t + \phi xb + \phi bp\} \tag{17}$$

where u0 is the amplitude of the light beam 20, and φxb is the phase change resulting from a positional deviation xb of the diffraction grating 15b in the X direction from the reference line 24 of the optical system. If the pitch of the diffraction grating 15b is denoted by p, it can be expressed by φxb=2πb/p. Also, φbp is the phase difference caused in the P-polarized light by diffraction, it being determined by the material and shape of the diffraction grating 15b.

On the other hand, the complex amplitude representation u2b of negative first order diffraction light 21b, from the diffraction grating 15b, of the light beam 20 of P-polarization having a frequency f2 (angular frequency w2) can be written as follows:

$$u2b = u0\exp\{w2 \cdot t + \phi xb + \phi bs\} \tag{18}$$

where φbx is the phase difference caused in the S-polarized light by diffraction, it being determined by the material and shape of the diffraction grating 15b.

Here, the alternating component Ia of the beat signal (first beat signal) produced at the sensor 10a as a result of heterodyne interference of the diffraction lights 20a and 21a, can be expressed as follows while taking the amplitude as I0:

$$Ia = I0 \cos\{(w1-w2)t + 2\phi xa + (\phi ap - \phi as)\} \tag{19}$$

Also, the alternating component Ib of the beat signal (second beat signal) produced at the sensor 10b as a result of heterodyne interference of the diffraction lights 20b and 21b, can be expressed as follows:

$$Ib = I0 \cos\{(w1-w2)t + 2\phi xb + (\phi bp - \phi bs)\} \tag{20}$$

The phase difference Δφ1 between the first and second beat signals represented by equations (19) and (20) is:

$$\begin{aligned}\Delta\phi 1 &= 2(\phi xa - \phi xb) + \{(\phi ap - \phi as) - (\phi bp - \phi bs)\} \\ &= 2\phi\Delta x + \{(\phi ap - \phi as) - (\phi bp - \phi bs)\}\end{aligned} \tag{21}$$

where φΔx is the phase change resulting from relative positional deviation Δx between the diffraction gratings 15a and 15b in the X direction, it being expressed as:

$$\phi\Delta x = 4\pi\Delta x/p \tag{22}$$

On the other hand, if the deviation of the diffraction grating 15a in the X direction from the reference line 24 of the optical system is denoted by xa', then the interference beat signal (third beat signal) Ia' of the diffraction light 20a and 21a, produced at the sensor 10b as both the polarization changing means 26a and 26b are placed in their ON positions, can be written as follows:

$$Ia' = I0 \cos\{(w1-w2)t + 2\phi xa' + (\phi as - \phi ap)\} \tag{23}$$

Also, if the deviation of the diffraction grating 15b in the X direction from the reference line 24 of the optical system is denoted by xb', then the interference beat signal (fourth beat signal) Ib' of the diffraction light 20b and 21b, produced at the sensor 10a, can be written as follows:

$$Ib' = I0 \cos\{(w1-w2)t + 2\phi xb' + (\phi bs - \phi bp)\} \tag{24}$$

Here, from equation (23), the phase difference Δφ2 between the third and fourth beat signals can be taken as in equation (24) below:

$$\begin{aligned}\Delta\phi 2 &= 2(\phi xa' - \phi xb') - \{(\phi ap - \phi as) - (\phi bp - \phi bs)\} \\ &= 2\phi\Delta x - \{(\phi ap - \phi as) - (\phi bp - \phi bs)\}\end{aligned} \tag{25}$$

Taking the sum Δφ of the phase differences Δφ1 and Δφ2 represented by equations (21) and (25) by means of the computing element 13, the term of the error (sandwiched between symbols "{" and "}") resulting from the shape and material of the diffraction grating, is canceled and the following is obtained:

$$\begin{aligned}\Delta\phi &= \Delta\phi 1 + \Delta\phi 2 \\ &= 4\phi\Delta x \\ &= 8\pi\Delta x/p\end{aligned} \tag{26}$$

Thus, the relative positional deviation Dx between the diffraction grating 15a and 15b, that is, the positional deviation between a circuit pattern printed through the N-th exposure process and a circuit pattern printed through the (N+1)-th exposure process, can be determined in accordance with the following equation:

$$\Delta x = \Delta\phi \cdot P/(8\pi) \tag{27}$$

As regards the error due to any rotational component of the mark with respect to the detection optical system, for example it can be canceled such that: an additional reference mark consisting of two diffraction gratings having no deviation may be printed on a wafer the same time as the diffraction grating 15a, for example, is printed; and thus, by detecting them, the error resulting from the rotational component as well as the offset value of the optical system can be removed on the basis of the detected (as correction value).

While the present embodiment has been described in connection with the X direction, the above-described process can be applied also to the Y direction: additional diffraction gratings for detection of Y-axis direction deviation may be printed and an additional optical system for detection of the Y-axis direction deviation may be provided; or alternatively, the rotatable stage may be rotated by 90 degrees from the position shown in FIG. 8 and phase difference detection may be performed and, subsequently, it may be further rotated by 180 degrees from that position and phase difference detection may be performed, such that, on the basis of two signals thus obtained, any positional deviation Δy in the Y direction may be measured.

Figure 10:
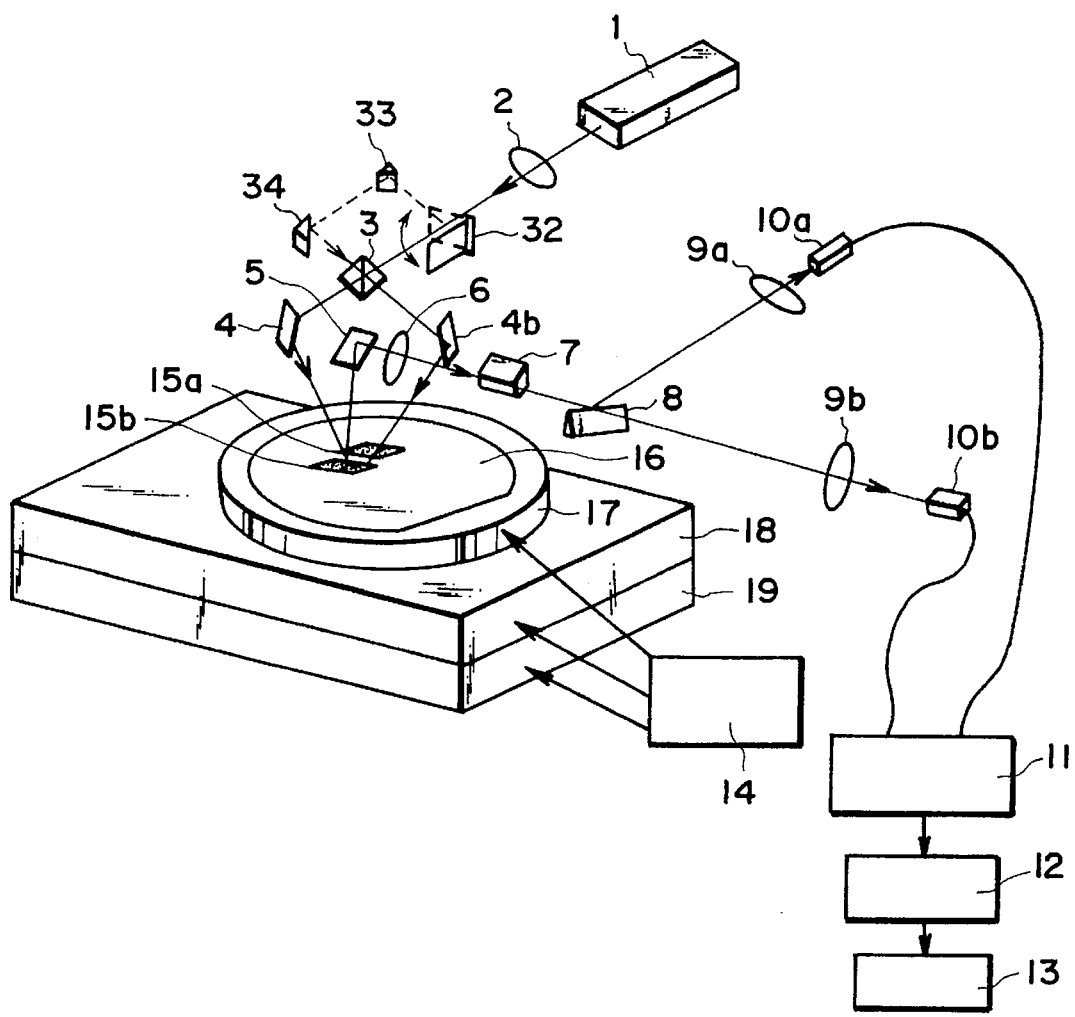
FIG. 10 is a schematic view of a positional deviation detecting system according to a third embodiment of the present invention.
Figure 11A:
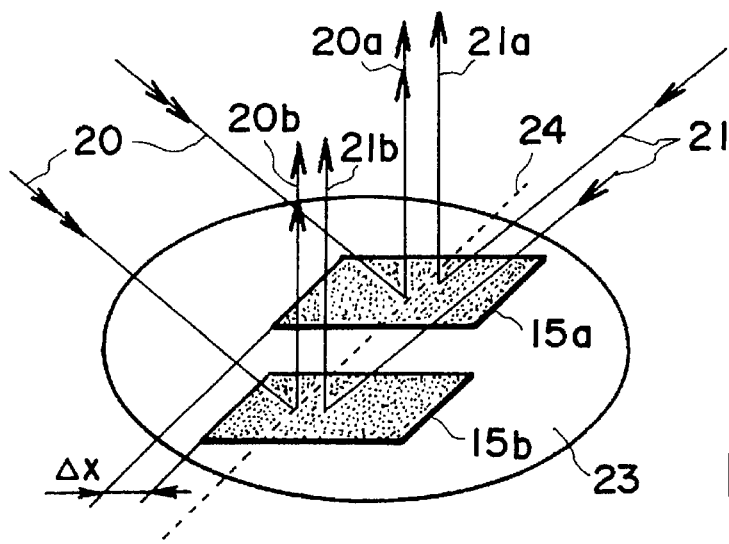
FIGS. 11A and 11B are enlarged views, respectively, of portions of FIG. 10.
Figure 11B:
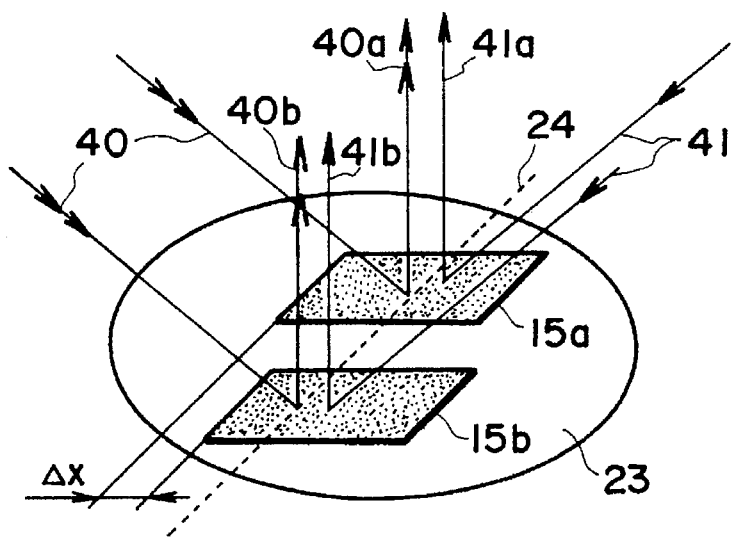

FIG. 10 is a schematic view of a main portion of a third embodiment of the present invention. FIGS. 11A and 11B each is an enlarged view of a portion of FIG. 10. This embodiment differs from the first embodiment of FIG. 4 in that a deflection mirror 32 is used to change, after light from a two-wavelength crossing polarization laser 1 passes a collimator lens 2, the surface of the polarization beam splitter 3 on which the light will impinge. The remaining portion is of the same structure.

More specifically, as shown in FIGS. 11A and 11B, the selection is made between two cases: a case where light beam 20 of P-polarization and having a frequency f1 is projected onto the diffraction gratings 15a and 15b from the left while light beam 21 of S-polarization and having a frequency f2 is projected onto them from the right, and a case where light beam 40 of S-polarization and having a frequency f2 is projected onto them from the left while light beam 41 of P-polarization and having a frequency f1 is projected onto them from the right.

The manner of measurement to be done in the present embodiment will be explained below, in conjunction with FIGS. 11A and B.

In a case where reflection by the deflection mirror 32 is not used, what to be obtained is the same as the signal produced before 180 degrees rotation of the wafer in the first embodiment. Thus, the same relation as defined by equation (8) is provided, and there is a phase difference $\Delta\phi 1$ between the first and second signals such as follows:

$$\Delta\phi 1 = 2(\phi xa - \phi xb) + \{(\phi ap - \phi as) - (\phi bp - \phi bs)\} \quad (28)$$
$$= 2\phi\Delta x + \{(\phi ap - \phi as) - (\phi bp - \phi bs)\}$$

On the other hand, if the deviation of the diffraction grating 15a in the X direction from the reference line 24 of the optical system is denoted by xa', the interference beat signal (third beat signal) Ia' of the diffraction light beams 40a and 41a, produced at the sensor 10a, in a case where reflection by the deflection mirror 32 is used so that, through reflection by mirrors 33 and 34, the light impinge on the polarization beam splitter 3, can be written as follows:

$$Ia' = I0 \cos\{(w1-w2)t - 2\phi xa' + (\phi ap - \phi as)\} \quad (29)$$

Also, if the deviation of the diffraction grating 15b in the X direction from the reference line 24 of the optical system is denoted by xb', the interference beat signal (fourth beat signal) Ib' of the diffraction light beams 40b and 41b, produced at the sensor 10b, can be written as follows:

$$Ib' = I0 \cos\{(w1-w2)t - 2\phi xb' + (\phi bp - \phi bs)\} \quad (30)$$

Here, taking from equation (29) a phase difference $\Delta\phi 2$ (equation (30)) between the third and fourth beat signals, it follows that:

$$\Delta\phi 2 = -2(\phi xa' - \phi xb') + \{(\phi ap - \phi as) - (\phi bp - \phi bs)\} \quad (31)$$
$$= -2\phi\Delta x + \{(\phi ap - \phi as) - (\phi bp - \phi bs)\}$$

Taking the difference $\Delta\phi$ between the phase differences $\Delta\phi 1$ and $\Delta\phi 2$ represented by equations (28) and (31) by means of the computing element 13, the term of the error (sandwiched between symbols "{" and "}") resulting from the shape and material of the diffraction grating, is canceled and the following is obtained:

$$\Delta\phi = \Delta\phi 1 - \Delta\phi 2 \quad (32)$$
$$= 4\phi\Delta x$$
$$= 8\pi\Delta x/p$$

Thus, the relative positional deviation $\Delta x$ between the diffraction gratings 15a and 15b, that is, the positional deviation between a circuit pattern printed through the N-th exposure process and a circuit pattern printed through the (N+1)-th exposure process, can be determined in accordance with the following equation:

$$\Delta x = \Delta\phi \cdot P/(8\pi) \quad (33)$$

Figure 13A:
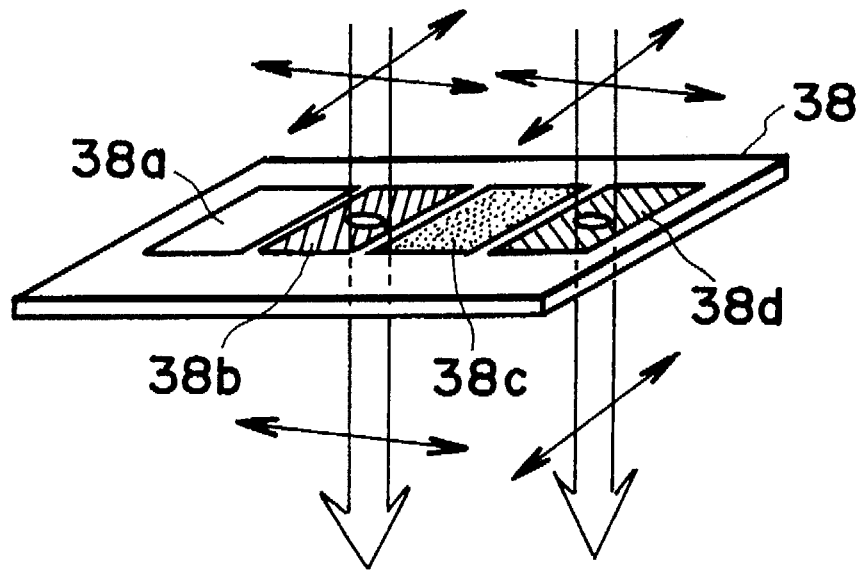
FIGS. 13A and 13B are enlarged views, respectively, of portions of FIG. 12.
Figure 13B:
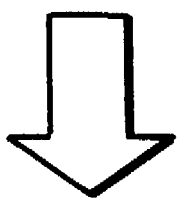
Figure 13B:
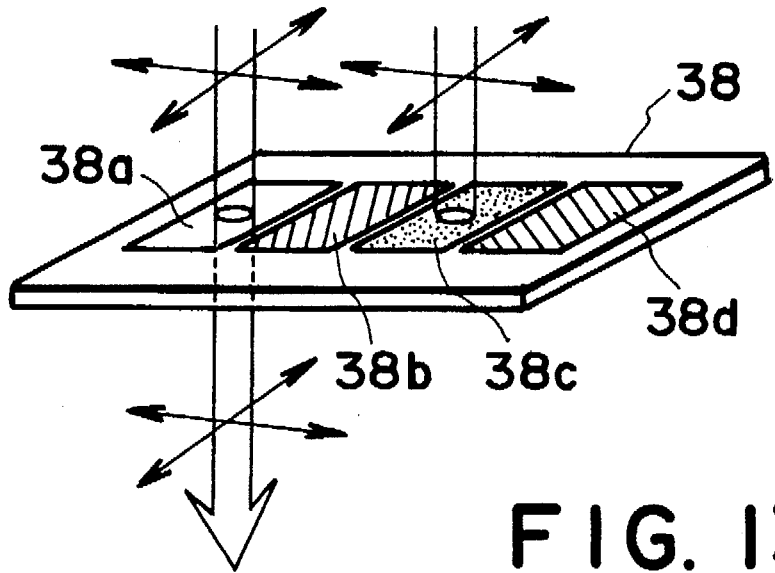

FIG. 12 is a schematic view of a main portion of a fourth embodiment of the present invention. FIGS. 13A, 13B, 14A and 14B each is an enlarged view of a portion of FIG. 12. This embodiment differs from the first embodiment of FIG. 4 in that light from a two-wavelength crossing polarization laser 1, after passing a collimator lens 2, is divided by a beam splitter 35, the divided light being projected on a polarization optical element 38. As shown in FIG. 13A or 13B, this polarization optical element 38 comprises a transmitting portion 38a, a polarization plate 38b for transmitting P-polarized light, a light blocking portion 38c, and a polarization plate 38d for transmitting S-polarized light. It can be moved slidably by an actuator 37 so as to change the light incidence position on the polarization optical element 38 between two alternatives. The remaining portion is of the same structure.

Figure 14A:
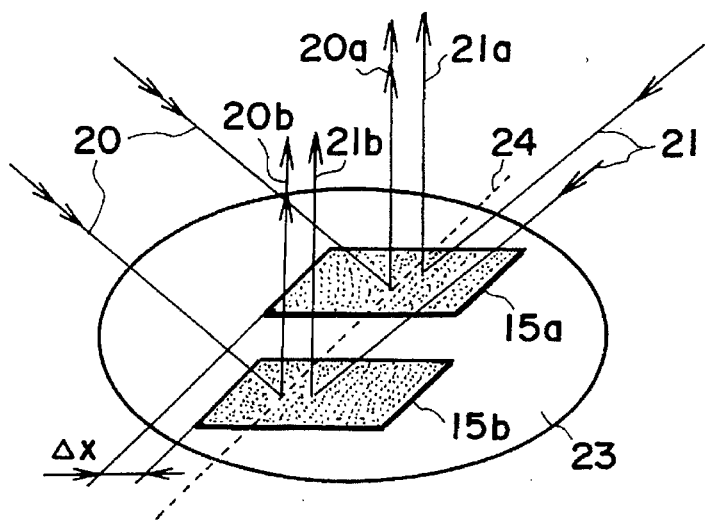
FIGS. 14A and 14B are enlarged views, respectively, of portions of FIG. 12.
Figure 14B:
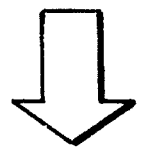
Figure 14B:
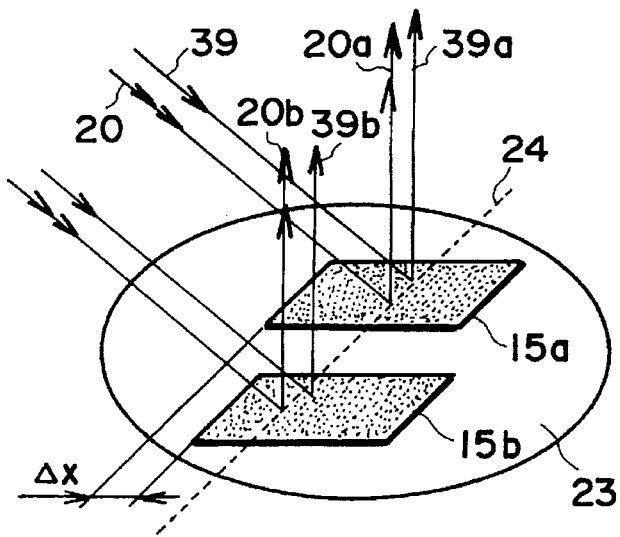

In this embodiment, as shown in FIGS. 14A and 14B, selection is made between two cases: a case where light beam 20 of a P-polarization and having a frequency f1 is projected onto the diffraction gratings 15a and 15b from the left while light beam 21 of S-polarization and having a frequency f2 is projected onto them from the right, and a case where light beam 20 of P-polarization and having a frequency f1 is projected onto them from the right while light beam 21 of S-polarization and having a frequency f2 is projected onto them from the right.

The manner of measurement to be done in this embodiment will be explained below in conjunction with FIGS. 13A–13B.

In a case where the state of light incidence upon the polarization optical element 38 is such as shown in FIG. 13A, what to be obtained is the same as the signal produced before 180 degrees rotation of the wafer in the first embodiment. Thus, the same relation as defined by equation (8) is provided, and there is a phase difference $\Delta\phi 1$ between the first and second signals such as follows:

$$\Delta\phi 1 = 2(\phi xa - \phi xb) + \{(\phi ap - \phi as) - (\phi bp - \phi bs)\} \quad (34)$$
$$= 2\phi\Delta x + \{(\phi ap - \phi as) - (\phi bp - \phi bs)\}$$

On the other hand, when the polarization optical element 38 is moved slidably so that the state of light incidence such as shown in FIG. 13A is established, as regards the interference beat signal (third beat signal) Ia' of diffraction light beams 20a and 39a produced at the sensor 10a, since the term concerning a phase change due to positional deviation of the diffraction grating 15a is not included, it can be written as follows:

$$Ia' = I0 \cos\{(w1-w2)t + (\phi ap - \phi as)\} \quad (35)$$

Also, as regards the interference beat signal (fourth beat signal) Ib' of diffraction light beams 20b and 39b produced at the sensor 10b, since the term concerning a phase change due do positional deviation of the diffraction grating 15b is not included, it can be written as follows:

$$Ib = I0 \cos\{(w1-w2)t + (\phi bp - \phi bs)\} \quad (36)$$

Here, taking from equation (35) a phase difference $\Delta\phi 2$ between the third and fourth beat signals of equation (36), it follows that:

$$\Delta\phi 2 = \{(\phi ap - \phi as) - (\phi bp - \phi bs)\} \quad (37)$$

Taking the difference Δø between the phase differences Δø1 and Δø2 represented by equations (34) and (37) by means of the computing element 13, the term of the error (sandwiched between symbols "{" and "}") resulting from the shape and material of the diffraction grating, is canceled and the following is obtained:

$$\Delta\phi = \Delta\phi1 - \Delta\phi2 \quad (38)$$
$$= 2\phi\Delta x$$
$$= 4\pi\Delta x/p$$

Thus, the relative positional deviation Δx between the diffraction gratings 15a and 15b, that is, the positional deviation between a circuit pattern printed through the N-th exposure process and a circuit pattern printed through the (N+1)-th exposure process, can be determined in accordance with the following equation:

$$\Delta x = \Delta\phi \cdot P/(4\pi) \quad (39)$$

Figure 15:
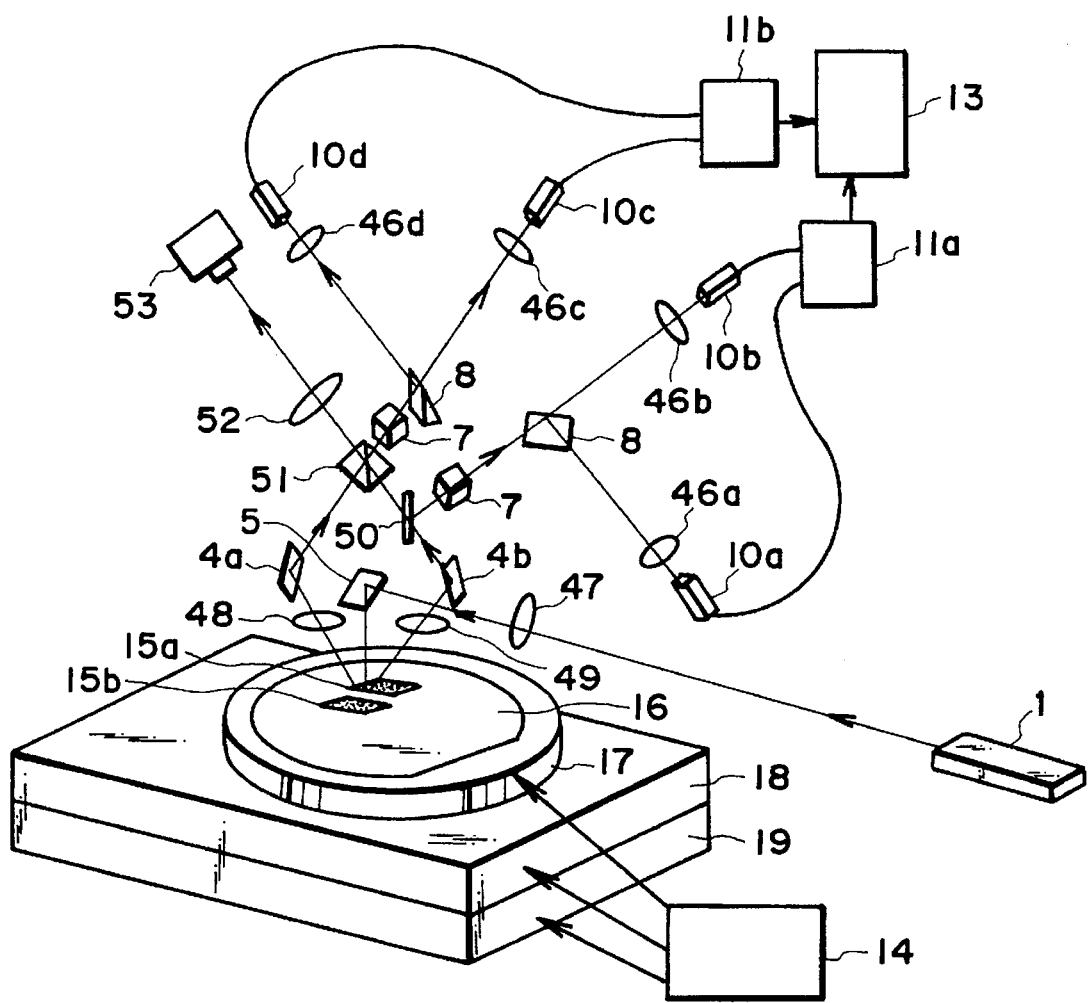
FIG. 15 is a schematic view of a main portion of a positional deviation detecting system according to a fifth embodiment of the present invention.

FIG. 15 is a schematic view of a main portion of a fifth embodiment of the present invention. In the first to fourth embodiments, the optical system is modified and, by using the results of twice measurements, the error attributable to the material or shape of the diffraction grating is corrected. In this embodiment, on the other hand, an error correcting optical system is provided separately to allow detection of two signals at once. This enables enhanced throughput of the apparatus.

Figure 21:
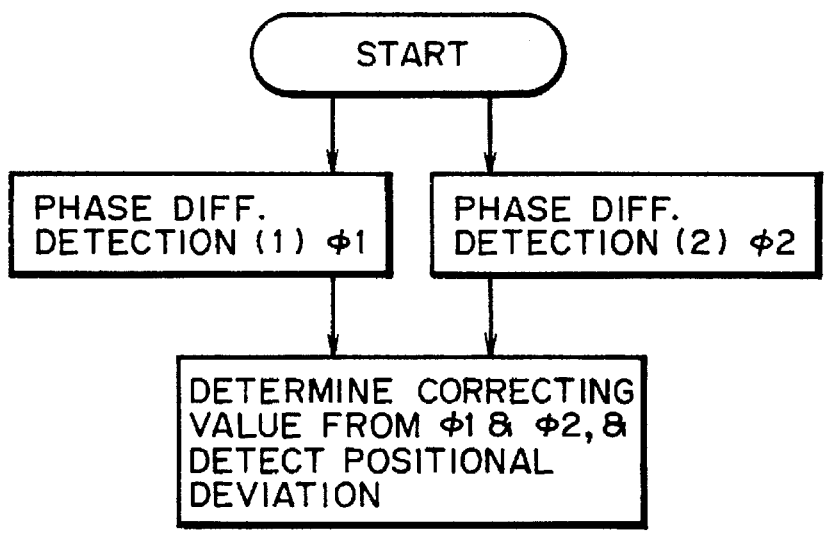
FIG. 21 is a flow chart of the operation of the fifth embodiment of the present invention.

FIG. 21 is a flow chart of the measurement sequence of this embodiment.

In FIG. 15, light from the polarization laser 1 goes through a collimator lens 47 and it is deflected by a mirror 5 so that it is projected on the wafer 16 perpendicularly. Diffraction light from the diffraction gratings 15a and 15b goes through a lens 48 (49) and it is deflected by a mirror 4a and is projected on a polarization beam splitter 51. By means of this polarization beam splitter 51, the light is bisected into two pairs of light beams: that is, a first pair of positive first order diffraction light of P-polarization having a frequency f1 and negative first order diffraction light of S-polarization having a frequency f2, from the diffraction gratings 15a and 15b; and a second pair of negative first order diffraction light of P-polarization having a frequency f1 and positive first order diffraction light of S-polarization having a frequency f2, from the diffraction gratings 15a and 15b. The second pair goes through a lens 52 and impinges on a CCD camera 53.

On the other hand, the first pair goes via a Glan-Thompson prism 7 and, by means of an edge mirror 8, it is separated into diffraction light from the diffraction grating 15a and diffraction light from the diffraction grating 15b. These light beams being separated are photoelectrically detected by sensors 10c and 10d, respectively, whereby beat signals (first and second beat signals) Ia and Ib are produced.

Disposed between the wafer 16 and the polarization beam splitter 5 is a half mirror 50, such that portions of the diffraction lights go through the Glan-Thompson prism 7 and then they are separated by the edge mirror 8 into diffraction light from the diffraction grating 15a and diffraction light from the diffraction grating 15b. These light beams being separated are then photoelectrically detected, whereby correction beat signals (third and fourth beat signals) Ira and Irb are produced.

The correcting phase difference Δø2 (Ira–Irb) obtainable at the phase difference meter 11a, can be expressed in the same manner as equation (37), as follows:

$$\Delta\phi2 = \{(\phi ap - \phi as) + (\phi bp - \phi bs)\} \quad (40)$$

Also, the phase difference Δø1 (Ia–Ib) between the first and second beat signals, as detectable by the phase difference meter 11b, can be expressed as follows:

$$\Delta\phi1 = 2(\phi xa - \phi xb) + \{(\phi ap - \phi as) - (\phi bp - \phi bs)\} \quad (41)$$
$$= 2\phi\Delta x + \{(\phi ap - \phi as) - (\phi bp - \phi bs)\}$$

Here, taking the difference Δø between the phase differences Δø1 and Δø2 represented by equations (41) and (40) by means of the computing element 13, the term of the error (sandwiched between symbols "{" and "}") resulting from the shape and material of the diffraction grating, is canceled and the following is obtained:

$$\Delta\phi = \Delta\phi1 = \Delta\phi2 \quad (42)$$
$$= 2 \cdot \phi\Delta x$$
$$= 4\pi\Delta x/p$$

Thus, the relative positional deviation Δx between the diffraction gratings 15a and 15b, that is, the positional deviation between a circuit pattern printed through the N-th exposure process and a circuit pattern printed through the (N+1)-th exposure process, can be determined in accordance with the following equation:

$$\Delta x = \Delta\phi \cdot P/(4\pi) \quad (43)$$

Figure 16:
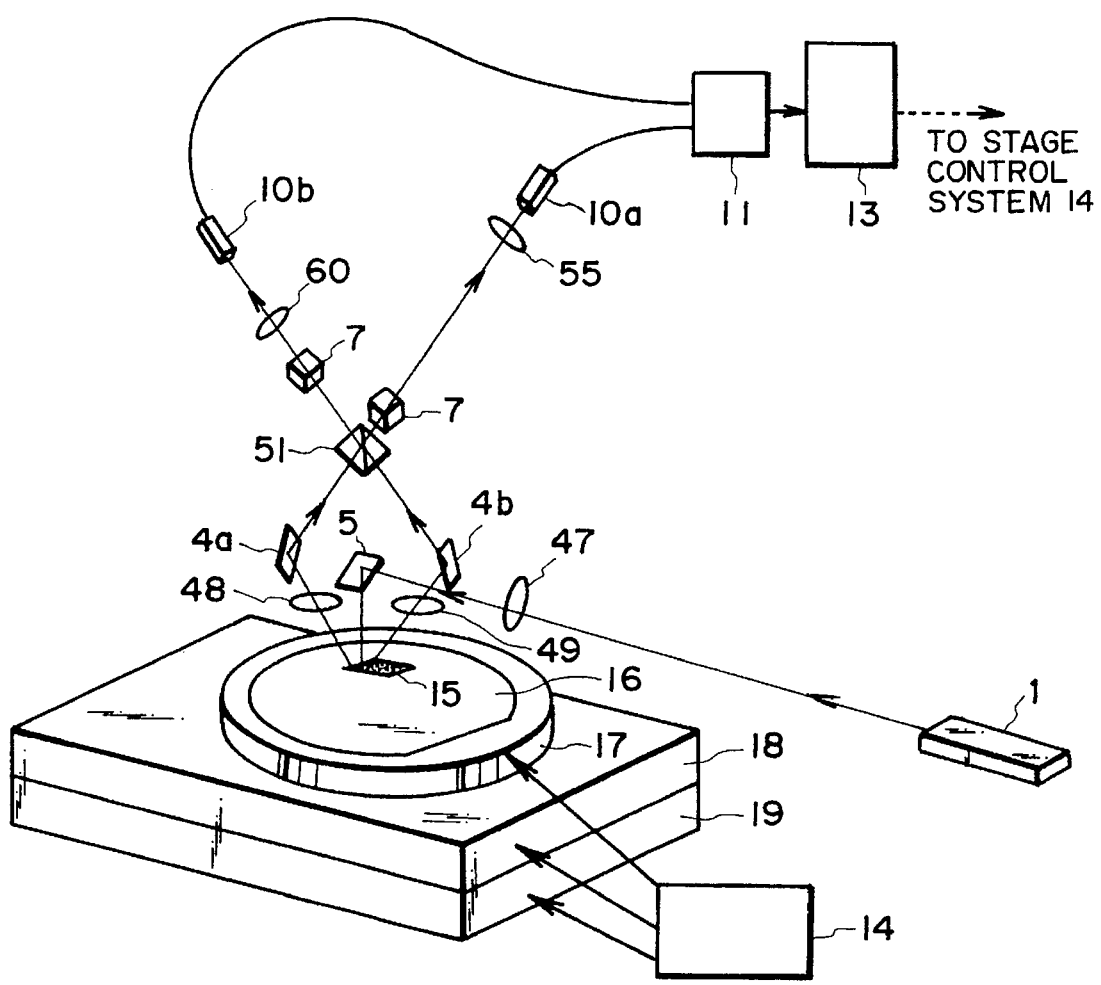
FIG. 16 is a schematic view of a main portion of a positional deviation detecting system according to a sixth embodiment of the present invention.

FIG. 16 is a schematic view of a main portion of a sixth embodiment of the present invention. In this embodiment, the invention is applied to a positioning system in a semiconductor device manufacturing exposure apparatus, for positioning a wafer with respect to the main body of the apparatus.

In FIG. 16, light emanating from a two-frequency crossing polarization laser 1 goes through a collimator lens 47, and it is then deflected by a mirror 5 so that it is projected on a wafer 16 perpendicularly. Diffraction light from a diffraction grating (alignment mark) 15 formed on the wafer 16 goes through a lens 48 (49), and it is deflected by a mirror 4a (4b) and is projected on a polarization beam splitter 51. By means of the polarization beam splitter 51, the light is bisected into two pairs of light beams: that is, a first pair of positive first order diffraction light of P-polarization having a frequency f1 and negative first order diffraction light of S-polarization having a frequency f2, from the diffraction grating 15; and a second pair of negative first order diffraction light of P-polarization having a frequency f1 and positive first order diffraction light of S-polarization having a frequency f2, from the diffraction grating 15. The first pair goes through a Glan-Thompson prism 7 and a lens 55, and it is received by a sensor 10a, whereby a positional deviation beat signal (first beat signal) Ia is produced.

On the other hand, the second pair goes through the Glan-Thompson prism 7 and a lens 60, and it is received by a sensor 10b, whereby a positional deviation beat signal (second beat signal) Ib is produced.

Here, a phase difference Δø (Ia–Ib) between the first and second beat signals as can be detected by the phase difference meter 11, is expressed as follows:

$$\Delta\phi = \{(\phi x + (\phi p - \phi s)) - (-\phi x + (\phi p - \phi s))\} \quad (44)$$
$$= 2\phi x$$

where øx is the phase change resulting from positional deviation x of the alignment mark (diffraction grating) of the wafer from a reference line of the optical system, it being expressed as øx=4πx/p. Also, øp and øs are phase changes which are caused in the P-polarized light and the S-polarized light, respectively, but independently of the positional deviation, when these lights are diffracted by the diffraction grating 15.

The amount x of positional deviation of the diffraction grating 15, that is, of the wafer 16 with respect to the exposure apparatus, can be calculated in the computing element 13 in accordance with the following equation:

$$x = \Delta\phi \cdot P/(4\pi) \quad (45)$$

After this, the stage is moved by an amount corresponding to the detected positional deviation x.

Figure 17:
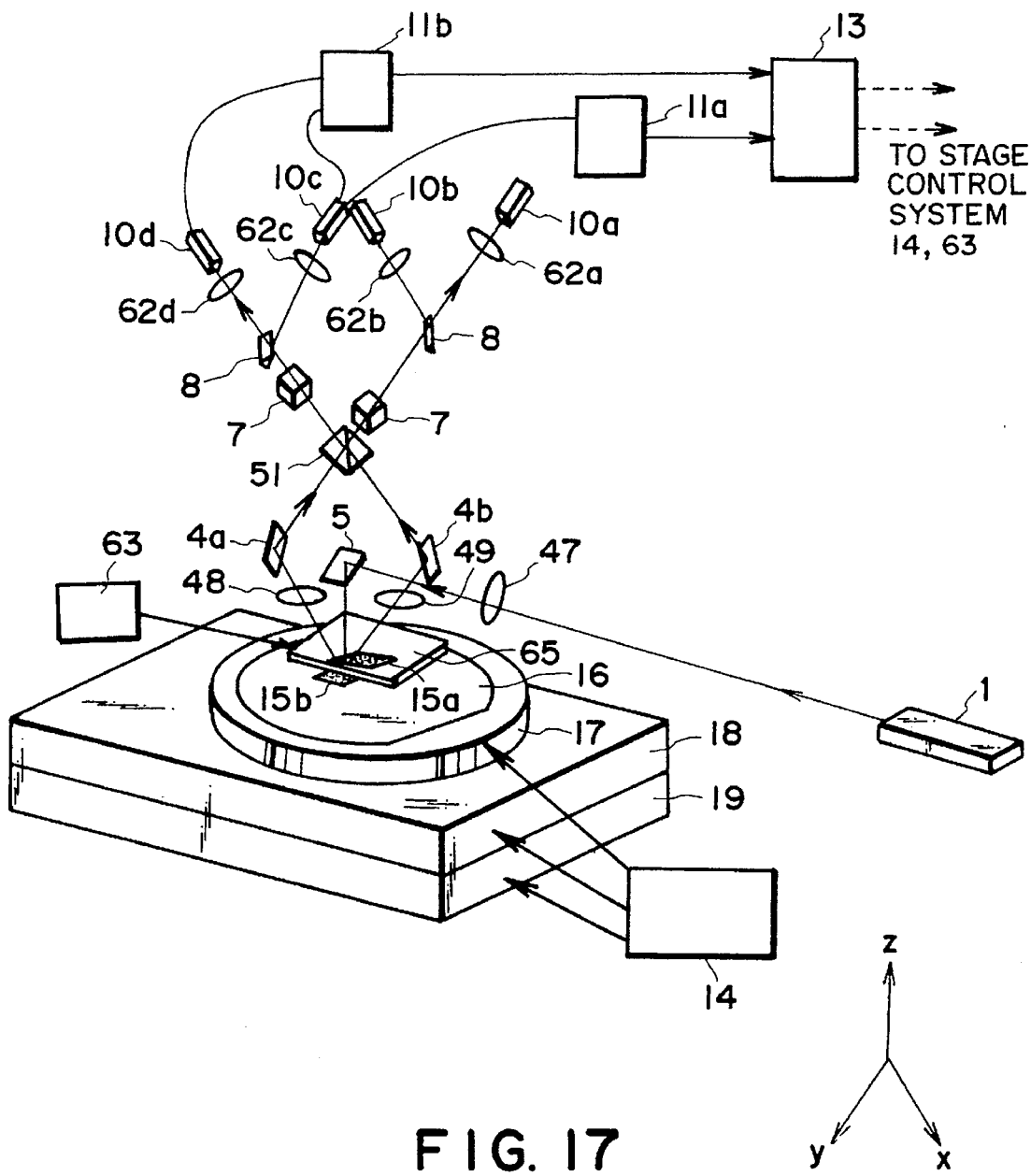
FIG. 17 is a schematic view of a main portion of a positional deviation detecting system according to a seventh embodiment of the present invention.
Figure 18:
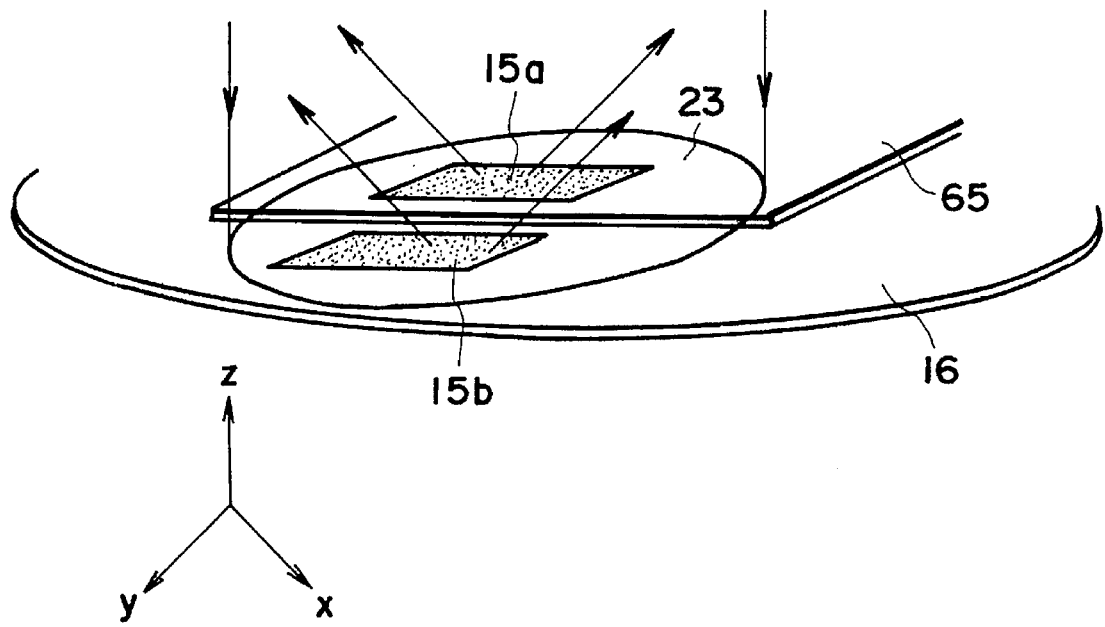
FIG. 18 is an enlarged view of a portion of FIG. 17.

FIG. 17 is a schematic view of a main portion of a seventh embodiment of the present invention. FIG. 18 is an enlarged view of a portion of FIG. 17. In this embodiment, the invention is applied to an alignment system in an X-ray semiconductor exposure apparatus.

FIG. 18 illustrates the relationship, in this embodiment, among a diffraction grating 15a (alignment mark) formed on a mask 65, a diffraction grating 15b (alignment mark) formed on a wafer 16 and a light spot 23 projected, as well as the direction of diffraction of light. There is a gap of about 10–30 microns between the mask 65 and the wafer 16 in the Z direction. Also, the diffraction gratings 15a and 15b relatively deviate by a small distance in the Y direction, and they do not overlap with each other.

In FIG. 17, light emanating from a two-frequency crossing polarization laser 1 goes through a collimator lens 47, and it is deflected by a mirror 5 so that it is projected on the wafer 16 perpendicularly. Diffraction light produced by the diffraction gratings 15a and 15b of the mask 65 and the wafer 16 go through lenses 48 and 49, respectively, and they are deflected by mirrors 4a and 4b, respectively, onto a polarization beam splitter 51.

By means of this polarization beam splitter 51, the light is bisected into two pairs of beams: a first pair of positive first order diffraction light of P-polarization having a frequency f1 and negative first order diffraction light of S-polarization having a frequency f2, from the diffraction gratings 15a and 15b; and a second pair of negative first order diffraction light of P-polarization having a frequency f1 and positive first order diffraction light of S-polarization having a frequency f2, from the diffraction gratings 15a and 15b. The first pair goes through a Glan-Thompson prism 7, and it is then separated by an edge mirror 8 into diffraction light from the diffraction grating 15a and diffraction light from the diffraction grating 15b. After this, they go through a lens 62a (62b) and are photoelectrically detected by a sensor 10a (10b), whereby positional deviation beat signals (first and second beat signals) Ia1 and Ib1 are produced.

The second pair goes through the Glan-Thompson prism 7 and it is then separated into diffraction light from the diffraction grating 15a and diffraction light from the diffraction grating 15b. Then they go through a lens 62c (62d), and they are photoelectrically detected by the sensor 10c (15d), whereby positional deviation beat signals (third and fourth beat signals) Ia2 and Ib2 are produced.

The phase difference $\Delta\phi 1$ (Ia1–Ib1) between the first and second beat signals, to be detected by a phase difference meter 11, can be expressed as follows:

$$\Delta\phi 1 = 2(\phi xa - \phi xb) + \{(\phi ap - \phi as) - (\phi bp - \phi bs)\} \quad (46)$$
$$= 2\phi\Delta x \{(\phi ap - \phi as) - (\phi bp - \phi bs)\}$$

Also, the phase difference $\Delta\phi 2$ (Ia2–Ib2) between the third and fourth beat signals, to be detected by a phase difference meter 11b, can be expressed as follows:

$$\Delta\phi 2 = -2(\phi xa - \phi xb) + \{(\phi ap - \phi as) - (\phi bp - \phi bs)\} \quad (47)$$
$$= -2\phi\Delta x\{(\phi ap - \phi as) - (\phi bp - \phi bs)\}$$

In these equations, $\phi xa$ and $\phi xb$ are phase changes resulting from deviations xa and xb of the diffraction gratings 15a and 15b of the mask 65 and the wafer 16, respectively, from a reference of the optical system. They can be expressed as $\phi xa = 4\pi xa/p$ and $\phi xb = 4\pi xb/p$, respectively. Also, $\phi ap$ and $\phi as$ are phase changes caused in the P-polarized light and S-polarized light, respectively, by diffraction at the diffraction grating 15a. Their values are changeable with replacement of the masks in exposure processes. Further, $\phi bp$ and $\phi bs$ are phase changes caused in the P-polarized light and S-polarized light, respectively, by diffraction at the diffraction grating 15b. Their values are changeable with the shape and/or material of the diffraction grating 15b used in exposure processes.

Taking the difference $\Delta\phi$ between the phase differences $\Delta\phi 1$ and $\Delta\phi 2$ represented by equations (46) and (47) by means of the computing element 13, the term of the error (sandwiched between symbols "{" and "}") resulting from the shape and material of the diffraction grating, is canceled and the following is obtained:

$$\Delta\phi = \Delta\phi 1 - \Delta\phi 2 \quad (48)$$
$$= 2\phi\Delta x$$
$$= 4\pi\Delta x/p$$

Thus, the relative positional deviation $\Delta x$ between the diffraction gratings 15a and 15b, that is, the positional deviation between a circuit pattern printed through the N-th exposure process and a circuit pattern printed through the (N+1)-th exposure process, can be determined in accordance with the following equation:

$$\Delta x = \Delta\phi \cdot P/(4\pi) \quad (49)$$

Thus, by moving one of or both of the mask and the wafer through a corresponding control system 63 or 14 so as to reduce $\Delta x$ to zero, high precision alignment can be accomplished.

While in the foregoing embodiments the invention has been explained with reference to a unit magnification exposure apparatus in which a mask and a wafer are placed close to each other, the invention is of course applicable also to a reduction projection exposure apparatus.

Figure 19:
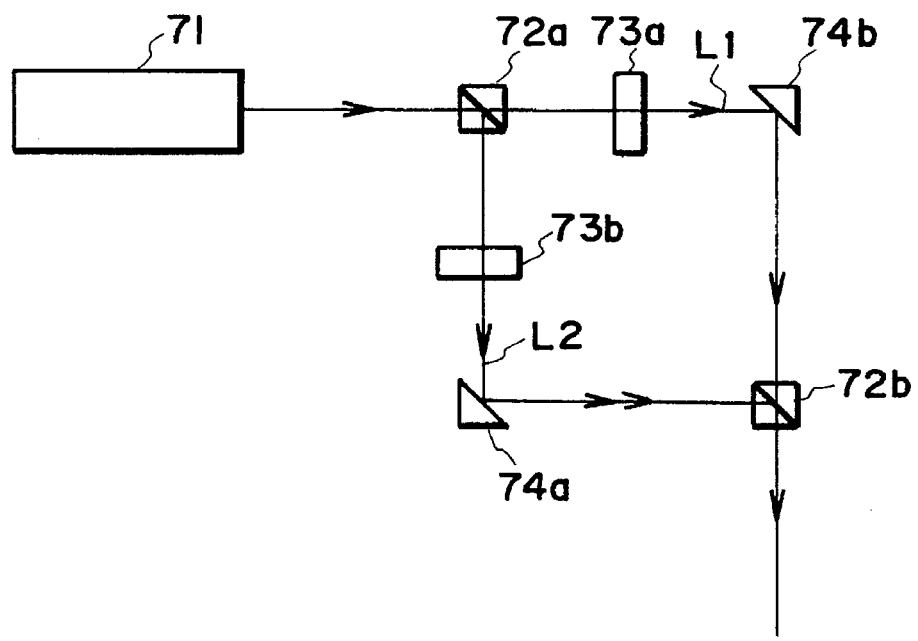
FIG. 19 is a schematic view of a portion of a positional deviation detecting system according to an eighth embodiment of the present invention.

FIG. 19 is a schematic view of a portion of an eighth embodiment of the present invention. While in the first to seventh embodiments a two-frequency crossing polarization laser is used as a light source, in these embodiments an opto-acoustic optical device may be used as a light source such as shown in FIG. 19.

In FIG. 19, light emanating from a single-frequency laser 71 enters a polarization beam splitter 72a, by which it is bisected in dependence upon the direction of polarization. The light transmitted is frequency-modulated by an opto-acoustic optical device 73a, such that it is transformed into light L1 of a frequency f1. On the other hand, the light reflected is modulated by another opto-acoustic optical device 73b, such that it is transformed into light L2 of a frequency f2. Subsequently, they are combined by a polarization beam splitter 72b, whereby light of P-polarization having a frequency f1 and light of S-polarization having a frequency f2, both advancing along the same path, are produced.

Figure 22:
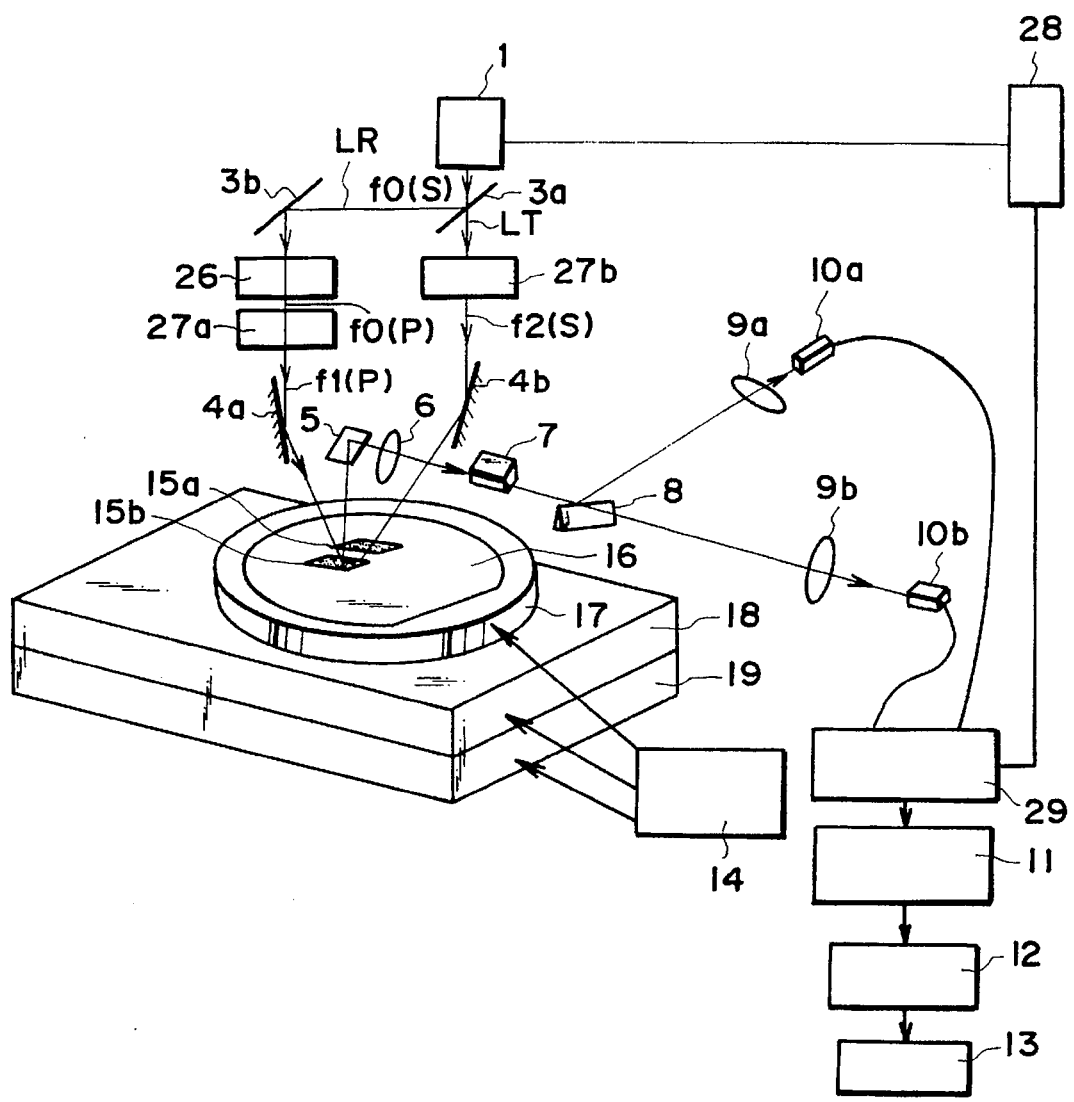
FIG. 22 is a schematic view of a main portion of a positional deviation detecting system according to ninth embodiment of the present invention.

FIG. 22 is a schematic view of a main portion of a ninth embodiment of the present invention.

In this embodiment, the invention is applied to the measurement of the registration precision between a pattern transferred for a first time and a pattern transferred for a second time, in superposed printing of circuit patterns on a wafer.

Denoted in FIG. 22 at 1 is a light source means (light source) which comprises a polarization modulation laser diode (LD), for example. S-polarized light of a frequency f1 from the light source 1 is divided by a half mirror (light splitter) 2 into two light beam. Of these light beams, the light Lt passed through the half mirror 3a is modulated by an acousto-optic modulator (AOM) (frequency modulating means) 27b into light f2(S) of a frequency f2. This modulator serves to modulate the frequency to 60 MHz, for example.

The light LR reflected by the half mirror 2 is reflected by a mirror 3b, and it is then influenced by a half waveplate (polarization plane changing means) 26 so that the direction of polarization of it is rotated by 90 degrees, whereby P-polarized light f0(P) of a frequency f0 is provided.

Subsequently, by an acousto-optic modulator (frequency modulating means) 27a, it is modulated into light f1(P) for a frequency f1. This modulator serves to modulate the frequency to 61 MHz, for example. Then, the light f1(P) is projected via a mirror 4a while the light f2(S) is projected via a mirror 4b, both onto the first and second diffraction grating 15 (15a and 15b) formed on the wafer 16.

Here, the incidence angles of the two light beams f1(P) and f2(S) are so set that first order diffraction light from the first and second diffraction gratings are reflectively diffracted from the diffraction grating perpendicularly. More specifically, they are so set that negative first order diffraction light of the light f1(P) and positive first order diffraction light of the light f2(S) are reflectively diffracted, perpendicularly with respect to the wafer 16. Then, these two reflective diffraction light beams are reflected by a mirror 5 and are collected by a lens 6. Subsequently, they are bisected by means of a Glan-Thompson prism 7 and an edge mirror 8, and then are collected by lenses 9a and 9b, respectively, whereby they are directed to sensors 10a and 10b, respectively.

Denoted at 18 is a Y stage, and denoted at 19 is an X stage. These stages are movable along Y and X directions, respectively. Denoted at 17 is a rotatable stage for carrying a wafer thereon. Denoted at 14 is a stage control system.

Figure 23A:
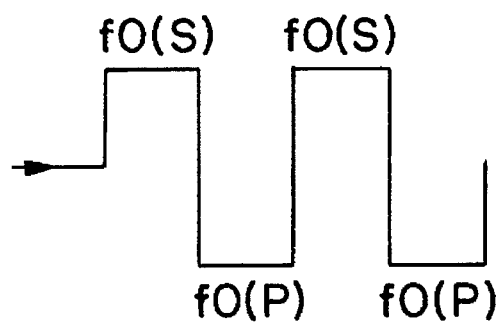
FIG. 23 is a schematic view for explaining plane of polarization of light of FIG. 22.
Figure 23B:
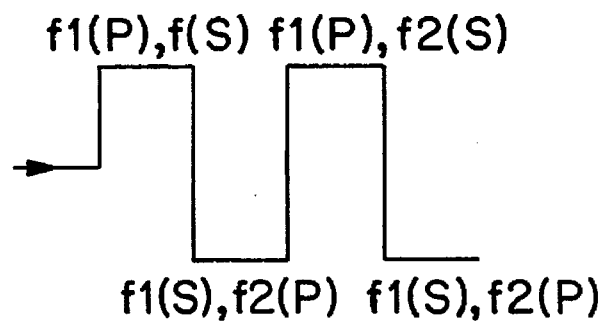

FIG. 23 is a schematic view for explaining the plane of polarization of light in FIG. 22. FIG. 23(A) illustrates the polarization plane of light emanating from the light source 1, and the plane of polarization changes at a period of about 100 msec. FIG. 23(B) illustrates the polarization planes of two light beams f1(P) and f2(S) irradiating the diffraction grating 15, and they change at a period of about 100 msec.

Figure 24A:
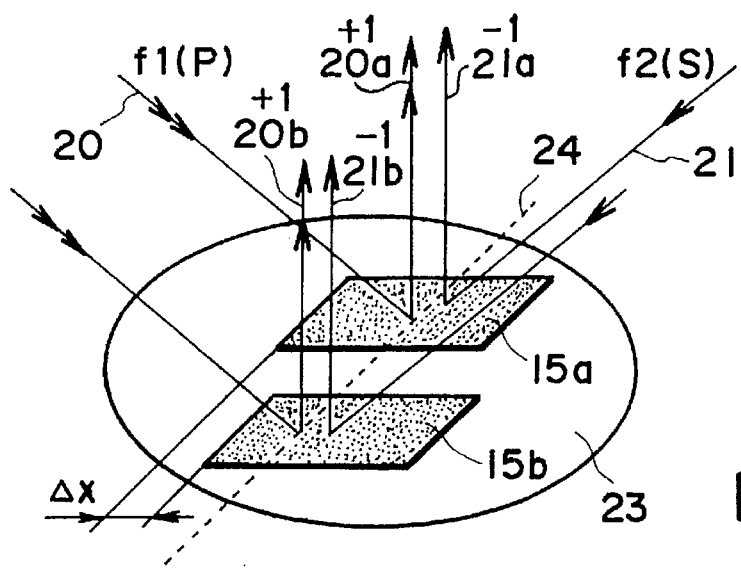
FIGS. 24A and 24B are enlarged views, respectively, of portions of FIG. 22.
Figure 24B:
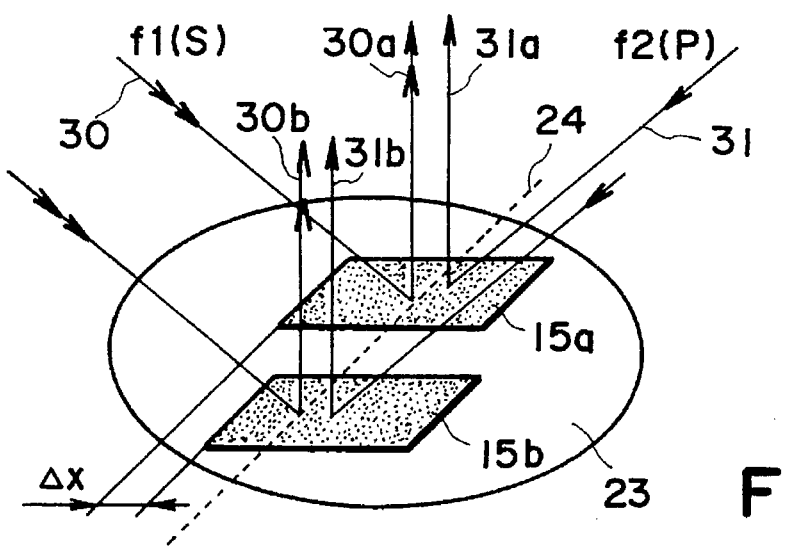

FIGS. 24A and 24B are schematic views, respectively, for explaining incidence of light upon the first and second diffraction gratings 15a and 15b, formed on the wafer 16, as well as diffraction of them.

In FIGS. 24A and 24B, light beam 20 corresponds to the light f1(P) of FIG. 21, and light beam 21 corresponds to the light f2(S) of FIG. 21.

In the light beam 20 of P-polarization having a frequency f1 of FIG. 24A, the polarization plane changes at a period of about 100 msec, such that, as shown in FIG. 24B, light beam 30 of S-polarization having a frequency f1 (being illustrated at by f1(S)) is provided. Similarly, in the light beam 21 of S-polarization having a frequency f2, the polarization plane changes at a period of about 100 msec, such that light beam 31 of P-polarization having a frequency f2 (being illustrated at f2(P)) is provided.

In this embodiment, as shown in FIG. 22, light is projected on the first and second diffraction gratings 15a and 15b, and light diffracted thereby at a first order, are reflected by a mirror 5 and collected by a lens 6. Then, after being influenced by a Glan-Thompson prism 7, the polarization planes of S-polarized light and P-polarized light are registered with each other.

Subsequently, these two light beams are separated by an edge mirror 8 into diffraction light from the diffraction grating 15a and diffraction light from the diffraction grating 15b. The thus separated light beams then go through lenses 9a and 9b, respectively, and are received by sensors (e.g. photodiodes such as Pin or Avalanche) 10a and 10b, whereby first and second beat signals are produced, respectively.

The electrical signals (first and second beat signals) produced by photoelectric conversion by the sensors 10a and 10b, are applied to a gate circuit 29 and then to a phase difference meter 11. The gate circuit 29 opens/closes in response to a clock signal from an oscillator 28 operable synchronously with a drive pulse of the light source 1. The phase difference between the first and second signals is thus detected.

In a first phase difference detecting step, two diffraction lights f1(P) and f2(S) which are in the state shown in 1f 24A are subjected to optical heterodyne detection and a phase difference between first and second beat signals is detected. In a second phase difference detecting step, two diffraction light beam f1(S) and f2(P) which are in the state shown in FIG. 24B are subjected to optical heterodyne detection and a phase difference between first and second beat signals is detected. The thus detected two phase differences are recorded into a recording means 12.

Subsequently, on the basis of the data recorded in the recording means 12, the computing element 13 determines adding means for the phase differences of the first and second beat signals in two states illustrated in FIGS. 24A and 24B.

It is to be noted that the gate circuit, the phase difference meter 11, the recording means 12 and the computing element are components of the phase difference measuring means.

Now, the principle of positional deviation measurement in this embodiment will be explained in conjunction with FIGS. 24A and 24B.

The complex amplitude representation u1a of positive first order diffraction light 20a, from the diffraction grating 15a, of the light 20 of P-polarization having a frequency f1 (angular frequency w1), can be written as follows:

$$u1a = u0 \exp\{w1 \cdot t + \phi xa + \phi ap\} \quad (50)$$

where u0 is the amplitude of the light 20, and $\phi a$ is the phase change resulting from positional deviation xa in the X direction of the diffraction grating 15a from the reference line 24 of the optical system. If the pitch of the diffraction grating 15a is denoted by p, it is expressed that $\phi xa = 2\pi xa/p$. Also, $\phi ap$ is the phase change which is caused in the P-polarized light by diffraction, it being determined by the material and shape of the diffraction grating 15a.

On the other hand, the complex amplitude representation u2a of negative first order diffraction light 21a, from the diffraction grating 15a, of the light 21 of S-polarization having a frequency f2 (angular frequency w2), can be written as follows:

$$u2a = u0 \exp\{w2 \cdot t - \phi xa + \phi as\} \quad (51)$$

where $\phi ax$ is the phase change caused in the S-polarized light by diffraction, it being determined by the material and shape of the diffraction grating.

Similarly, the complex amplitude representation u1b of positive first order diffraction light 20b, from the diffraction grating 15b, of the light beam 20 of P-polarization having a frequency f1 (angular frequency w1), can be written as follows:

$$u1b = u0\exp\{w1\cdot t + \phi xb + \phi bp\} \tag{52}$$

where u0 is the amplitude of the light, øxb is the phase change resulting from the positional deviation xb in the X direction of the diffraction grating 15b from the reference line 24 of the optical system. If the pitch of the diffraction grating 15b is denoted by p, it can be expressed that øxb=2πxb/p. Also, øbp is the phase change caused in the P-polarized light by diffraction, it being determined by the material and shape of the diffraction grating 15b.

On the other hand, the complex amplitude representation u2b of negative first order diffraction light 21b, from the diffraction grating 15b, of the light beam 21 of S-polarization having a frequency f2 (angular frequency w2), can be written as follows:

$$u2b = u0\exp\{w2\cdot t - \phi xb + \phi bs\} \tag{53}$$

where øbs is the phase change caused in the S-polarized light by diffraction, it being determined by the material and shape of the diffraction grating.

Here, the alternating component Ia of the beat signal (first beat signal) produced at the sensor 10a as a result of heterodyne interference of the positive first order diffraction light beam 20a and negative first order diffraction light beam 21a, can be expressed as follows while taking the amplitude as I0:

$$Ia = I0\exp\{(w1-w2)t + 2\phi xa + (\phi ap - \phi as)\} \tag{54}$$

Also, the alternating component Ib of the beat signal (second beat signal) produced at the sensor 10b as a result of heterodyne interference of the positive first order diffraction light beam 20b and negative first order diffraction light beam 21b, can be expressed as follows:

$$Ib = I0\exp\{(w1-w2)t + 2\phi xb + (\phi bp - \phi bs)\} \tag{55}$$

The phase diffraction Δø1 between the first and second beat signals represented by equations (54) and (55) is:

$$\begin{aligned}\Delta\phi 1 &= 2(\phi xa - \phi xb) + \{(\phi ap - \phi as) - (\phi bp - \phi bs)\} \\ &= 2\phi\Delta x + \{(\phi ap - \phi as) - (\phi bp - \phi bs)\}\end{aligned} \tag{56}$$

where øΔx is the phase change resulting from relative positional deviation øΔx between the diffraction gratings 15a and 15b in the X direction, it being expressed as:

$$\phi\Delta x = 4\pi\Delta x/p \tag{57}$$

On the other hand, if the deviation of the diffraction grating 15a in the X direction from the reference line 24 of the optical system is denoted by xa', then the interference beat signal (first beat signal) Ia' of the positive first order diffraction light 20a and negative first order diffraction light 21a, produced at the sensor 10b in response to change of the state of polarization from the light source (polarization modulation laser diode) 1, that is, the light beam f1(P) changing into light beam f1(S) and the light beam f2(S) changing into light beam f2(P), can be written as follows:

$$Ia' = I0\exp\{(w1-w2)t + 2\phi xa' + (\phi as - \phi ap)\} \tag{58}$$

Also, if the deviation of the diffraction grating 15b in the X direction from the reference line 24 of the optical system is denoted by xb', then the interference beat signal (second beat signal) Ib' of the positive first order diffraction light 20b and negative first order diffraction light 21b, produced at the sensor 10a, can be written as follows:

$$Ib' = I0\exp\{(w1-w2)t + 2\phi xb' + (\phi bs - \phi bp)\} \tag{59}$$

Here, from equation (58), the phase difference Δø2 between the first and second beat signals of equation (59) can be taken as follows:

$$\begin{aligned}\Delta\phi 2 &= 2(\phi xa' - \phi xb') - \{(\phi ap - \phi as) - (\phi bp - \phi bs)\} \\ &= 2\phi\Delta x - \{(\phi ap - \phi as) - (\phi bp - \phi bs)\}\end{aligned} \tag{60}$$

Taking the sum Δø of the phase differences Δø1 and Δø2 represented by equations (56) and (60) by means of the computing element 13, the term of the error (sandwiched between symbols "{" and "}") resulting from the shape and material of the diffraction grating, is canceled and the following is obtained:

$$\begin{aligned}\Delta\phi &= \Delta\phi 1 + \Delta\phi 2 \\ &= 4\phi\Delta x \\ &= 8\pi\Delta x/p\end{aligned} \tag{61}$$

Thus, the relative positional deviation Δx between the diffraction gratings 15a and 15b, that is, the positional deviation between a circuit pattern printed through the N-th exposure process and a circuit pattern printed through the (N+1)-th exposure process, can be determined in accordance with the following equation:

$$\Delta x = \Delta\phi \cdot P/(8\pi) \tag{62}$$

As regards the error due to any rotational component of the mark with respect to the detection optical system, for example it can be canceled such that: an additional reference mark consisting of two diffraction gratings having no deviation may be printed on a wafer the same time as the diffraction grating 15a, for example, is printed; thus the error resulting from the rotational component as well as the offset value of the optical system can be removed by detecting the reference mark and by using the detected as the correction value.

While the present embodiment has been described in connection with the X direction, the above-described process can be applied also to the Y direction: additional diffraction gratings for detection of Y-axis direction deviation may be printed and an additional optical system for detection of the Y-axis direction deviation may be provided, and a projecting optical system may be rotated by 90 degrees to measure deviation in the Y direction.

Figure 25:
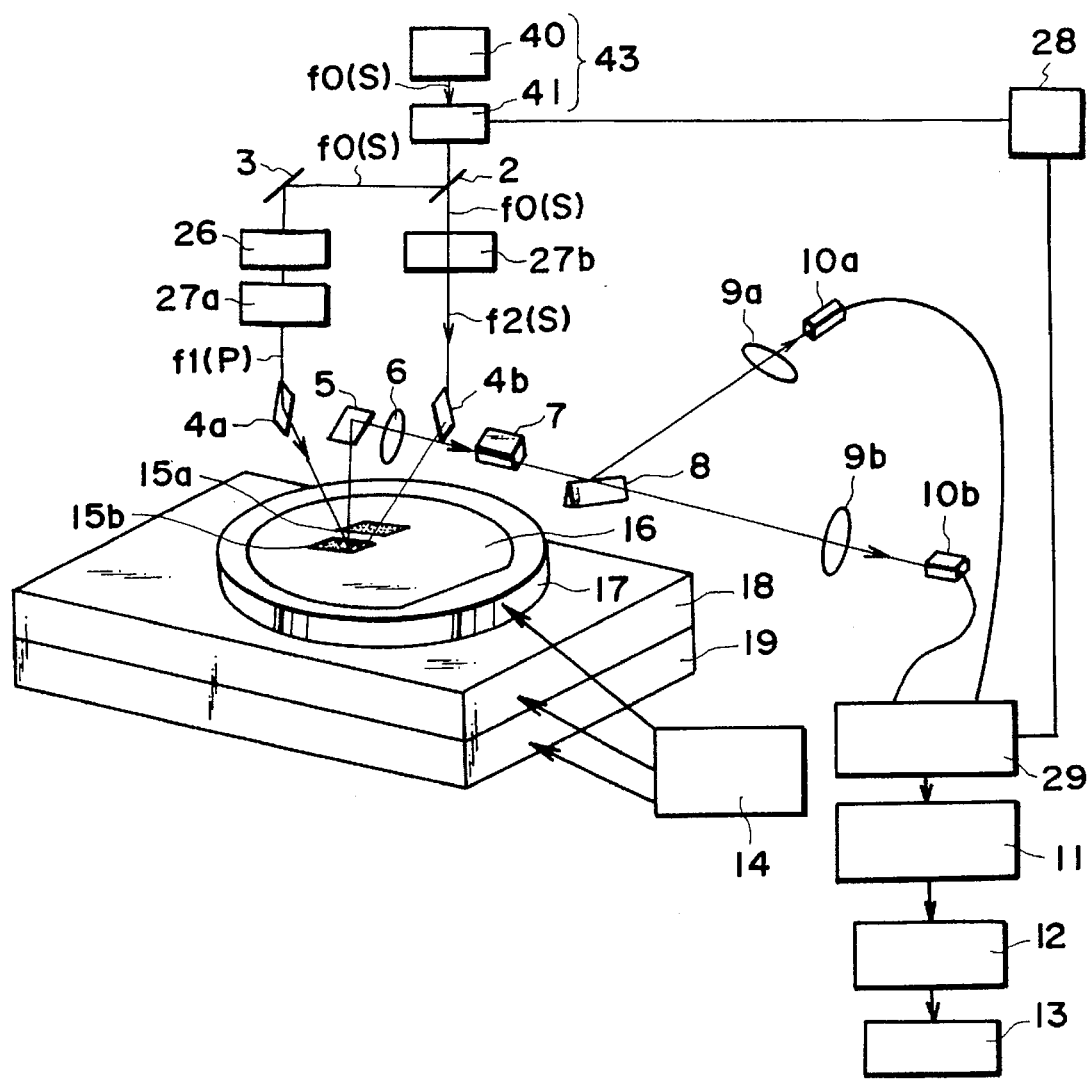
FIG. 25 is a schematic view of a main portion of a positional deviation detecting system according to a tenth embodiment of the present invention.

FIG. 25 is a schematic view of a main portion of a tenth embodiment of the present invention.

This embodiment differs from the ninth embodiment of FIG. 22 in that light source means 43 comprises a light source 40, such as a He—Ne laser or a semiconductor laser, and a light modulator 41 such as a liquid crystal deflector, for example, having a period of 100 msec., for example: the plane of polarization of light from the light source means 43 (S-polarized light of frequency f0 as in the ninth embodiment) being changed with a period of about 100 msec in accordance with pulse signals from an oscillator 28. The remaining portion is of the same structure as the preceding embodiment.

Namely, as compared with the preceding embodiment, this embodiment is different in that the polarization plane of the light from the light source 40 and to be projected on the diffraction gratings 15a and 15b, is changed by means of the light modulator 14 having a liquid crystal 31. The principle of measurement of positional deviation itself is the same as in the preceding embodiment.

Figure 26:
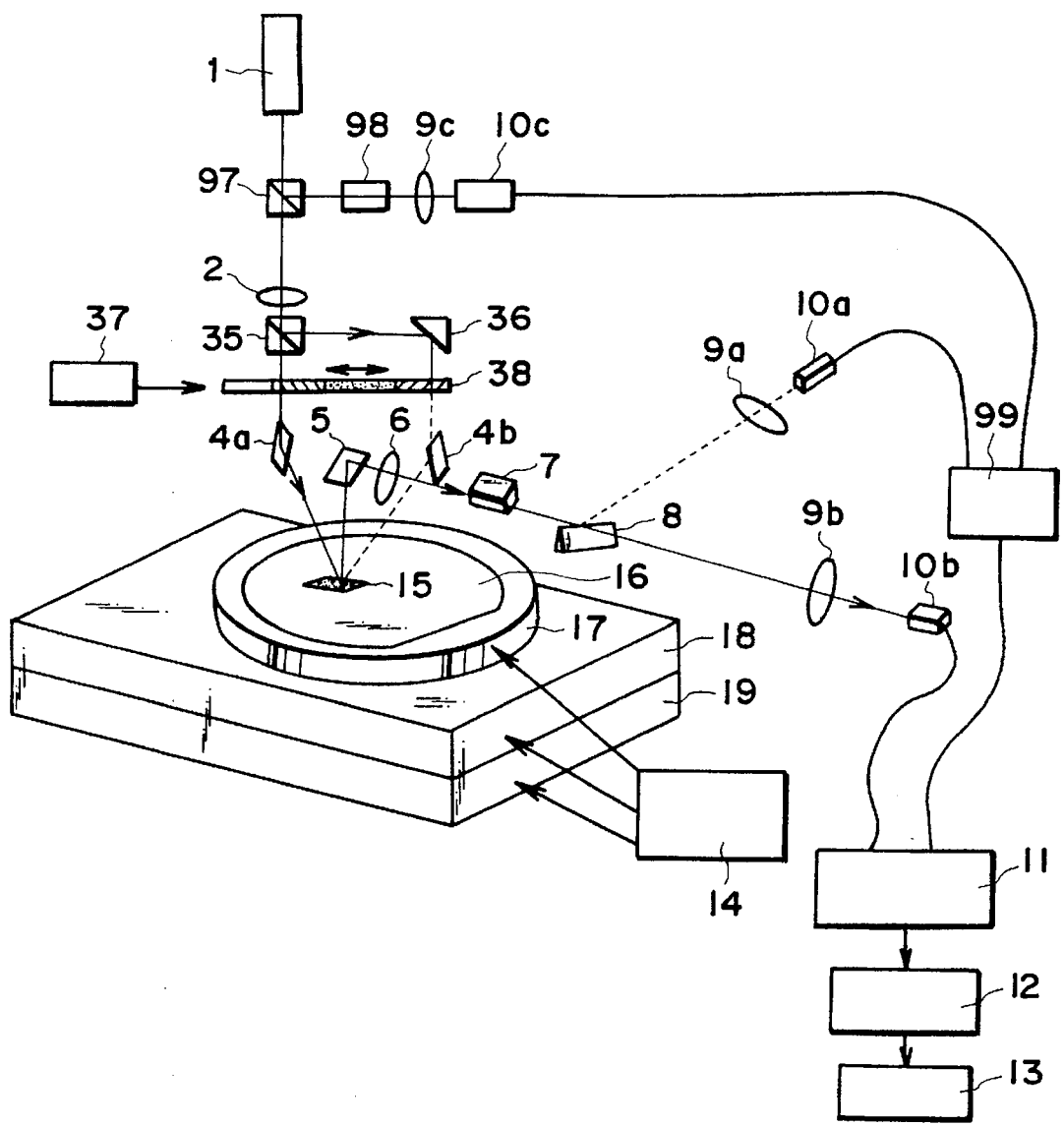
FIG. 26 is a schematic view of main portion of an eleventh embodiment of the present invention, being applied to a pattern linewidth measuring system for measuring the linewidth of a pattern printed on a wafer through an exposure apparatus.

FIG. 26 is a schematic view of an eleventh embodiment of the present invention, which is applied to a linewidth measuring system. This system can be used in combination with the registration precision measurement of FIG. 12. For the linewidth measurement, a polarization optical element is placed into the state shown in FIG. 22 so that light of frequencies f1 and f2 impinge on one side thereof. Also, signal selecting means 99 operates to apply a reference beat signal produced by a sensor 11c to a phase difference meter 11.

In FIG. 22, light emanating from a two-frequency crossing polarization laser 1 is divided by a beam splitter 97. The light reflected is received by a Glan-Thompson prism by which the polarization direction is registered. Then, it is collected by a lens 9c onto the sensor 10c. The ligth passing through the beam splitter 97 is bisected by another beam splitter 35, the split light beams being received by a polarization optical element 38. This polarization optical system 38 serves to project, onto the diffraction grating 15, only the light having passed the beam splitter 35. The diffraction light travels via a lens 6, a Glan-Thompson prism 7, an edge mirror 8 and a lens 9b, and impinges on a sensor 10b.

The interference beat signal Ib produced by the sensor 10b does not include a term of phase change due to a positional deviation of the diffraction grating 15, and it can be written as follows:

$$Ib = I0 \exp\{(w1-w2)t+(\phi p - \phi s)\} \quad (63)$$

where $\phi p$ and $\phi s$ are phase changes in the P-polarized light and S-polarized light, respectively, as determined by the material or shape of the diffraction grating 15.

On the other hand, the reference beat signal Ic produced by the sensor 10c can be expressed as follows:

$$Ic = I0 \exp\{(w1-w2)t\} \quad (64)$$

Here, if the phase change $\Delta\phi$ of equation (36) is taken out of equation (35), then:

$$\Delta\phi = \phi p - \phi s$$

The quantities $\phi p$ and $\phi s$ are dependent upon the material and/or shape of the diffraction grating 15. If, however, the material is determined (e.g., a resist pattern on a silicone) and the pattern thickness is fixed (a resist pattern being able to be controlled in nm order through spin coating), then it becomes dependent on the line width of each grating element of the diffraction grating.

Figure 27:
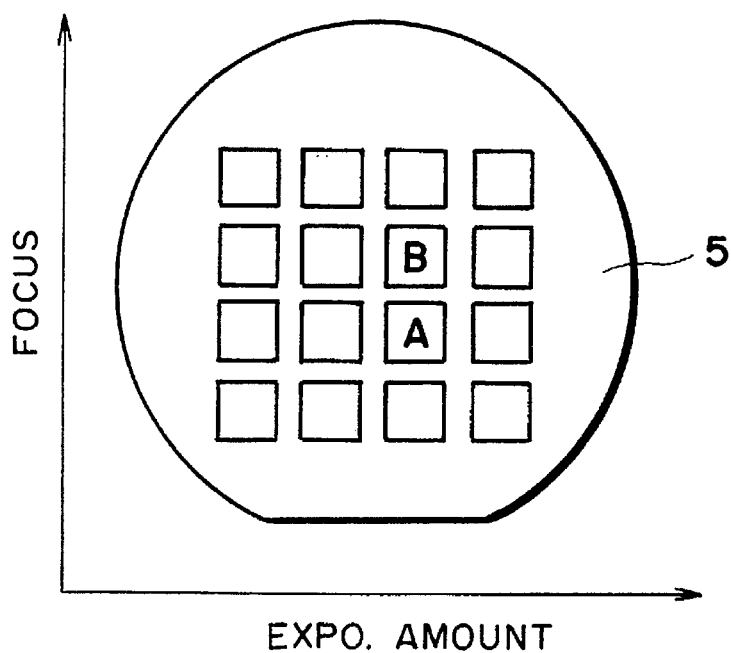
FIG. 27 is a schematic view for explaining the elevation on the wafer in the FIG. 26 embodiment.

FIG. 27 is a schematic view for explaining a wafer for optimum exposure conditioning in an optical stepper, wherein a line-and-space pattern, for example, is printed on the wafer repeatedly while, for every shot (exposure zone), the stepper exposure amount and the focus position are changed, to thereby determine the exposure condition by which a desired lien width is attained. Usually, when a new semiconductor process is going to be initiated or if the operation of a stepper should be checked periodically in consideration of a change in the stepper with time, it is necessary to identify or check the optimum exposure condition.

Figure 28:
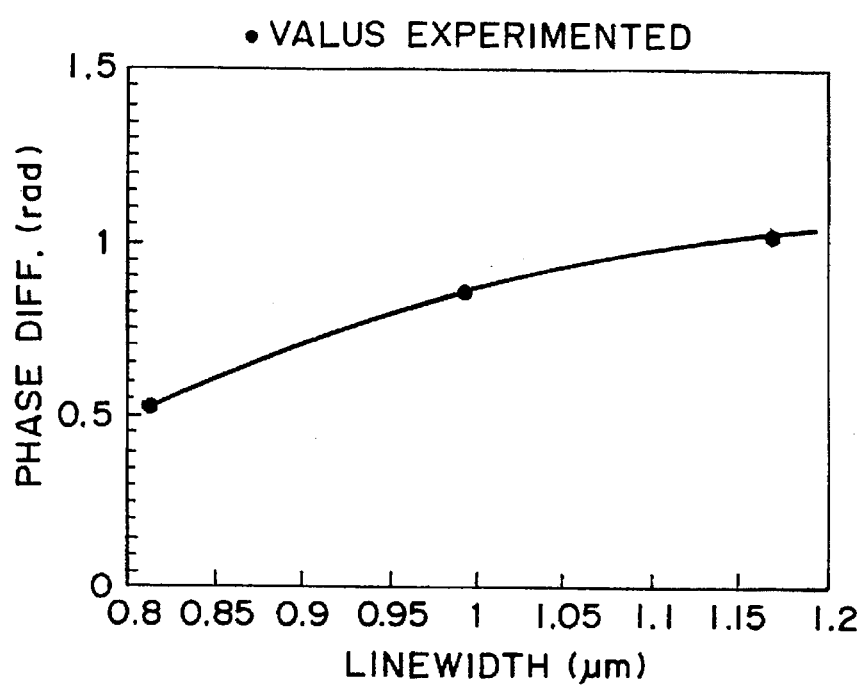
FIG. 28 is a graph for explaining the results of evaluation of diffraction gratings of different linewidths, made in the FIG. 27 embodiment.

A diffraction grating of a design line-and-space of 1 micron was repeatedly printed on a wafer with a resist thickness of 1 micron, while changing the exposure amount and the focus. The line widths of the printed diffraction grating in zones (shots) A and B were measured by using a laser microscope. The results were 0.99 micron and 0.81 micron. The same wafer was measured by using the linewidth measuring system of the present invention and, in terms of phase difference $\Delta\phi$, 0.838 radian and 0.524 radian were shown. FIG. 28 illustrates the results of experiments and it represents the relationship between the linewidth and the phase difference $\Delta\phi$. Because of a completely common path for the beam path, as regards the signal stability it is not at all affected by air fluctuation. It depends on the stability of phase difference meter, and the result was 0.0062 radian. This value, when converted into linewidth, corresponds to 3.5 nm, and it indicates a resolution of the order of a few nm. It is added here that, in the linewidth measuring method of this embodiment, calibration of the absolute linewidth should be done beforehand by using a measurement SEM, for example.

While the invention has been described with reference to the structures disclosed herein, it is not confined to the details set forth and this application is intended to cover such modifications or changes as may come within the purposes of the improvements or the scope of the following claims.

What is claimed is:

1. A deviation detecting system for detecting a relative positional deviation between first and second diffraction gratings, comprising:

a light source;

illuminating means for projecting first and second light beams from said light source, having different directions of polarization, onto the first and second diffraction gratings along different directions;

first signal detecting means for detecting a first interference light signal from the first diffraction grating, being based on a combination of diffraction light of the first light beam and diffraction light of the second light beam;

second signal detecting means for detecting a second interference light signal from the second diffraction grating, being based on a combination of diffraction light of the first light beam and diffraction light of the second light beam;

first phase difference detecting means for detecting a phase difference between the first and second interference light signals;

second phase difference detecting means for producing third and fourth interference light signals for correction of a phase error involved in the detected phase difference, and for detecting a phase difference between the third and fourth interference light signals, wherein the phase error is produced by the first and second diffraction gratings which differ with respect to their affect on the phase of light reflected therefrom in dependence upon the state of polarization of light impinging thereon; and determining means for determining the relative positional deviation between the first and second diffraction gratings on the basis of a phase difference as detected by said first and second phase difference detecting means.

2. A system according to claim 1, wherein the first and second light beams have wavelengths different from each other.

3. A system according to claim 1, wherein the first and second diffraction gratings are provided on a substrate, and wherein the substrate is rotated by 180 degrees relative to said illuminating means and then said illuminating means projects the first and second light beams upon the substrate such that diffraction light of the first light beam and diffraction light of the second light beam, both from the first diffraction grating, are combined with each other to produce the third interference light signal, while diffraction light of the first light beam and diffraction light of the second light beam, both from the second diffraction grating, are combined with each other to produce the fourth interference light signal.

4. A system according to claim 1, wherein said illuminating means includes polarization reversing means for mutually reversing the directions of polarization of the first and second light beams to provide third and fourth light beams, respectively, and wherein the third and fourth light beams are projected on the first and second diffraction gratings such that diffraction light of the third light beam and diffraction light of the fourth light beam both from the first diffraction grating are combined with each other to produce the third interference light signal, while diffraction light of the third light beam and diffraction light of the fourth light beam both from the second diffraction grating are combined with each other to produce the fourth interference light signal.

5. A system according to claim 4, wherein said polarization reversing means reverses the polarization in a time series.

6. A system according to claim 5, wherein said polarization reversing means includes a polarization modulation laser.

7. A system according to claim 4, wherein said first signal detecting means detects the third interference light signal, while said second signal detecting means detects the fourth interference light signal.

8. A system according to claim 1, wherein said determining means includes adding means for adding the phase differences to each other as detected by said first and second phase difference detecting means.

9. A system according to claim 1, wherein said illuminating means includes interchanging means for interchanging the first and second light beams with respect to one another to produce third and fourth light beams, respectively, and wherein said illuminating means projects the third and fourth light beams upon the first and second diffraction gratings such that diffraction light of the third light beam and diffraction light of the fourth light beam, both from the first diffraction grating, are combined with each other to produce the third interference light signal, while diffraction light of the third light beam and diffraction light of the fourth light beam, both from the second diffraction grating, are combined with each other to produce the fourth interference light signal.

10. A system according to claim 1, further comprising light projecting means for projecting a third light beam having the same direction of polarization as the first light beam and a fourth light beam having the same direction of polarization as the second light beam, upon the first and second diffraction gratings along the same direction of incidence of the first light beam, wherein diffraction light of the third light beam and diffraction light of the fourth light beam both from the first diffraction grating are combined with each other to produce the third interference light signal, while diffraction light of the third light beam, and diffraction light of the fourth light beam both from the second diffraction grating are combined with each other to produce the fourth interference light signal.

11. A measuring system for measuring the width of a line constituting a diffraction grating, comprising:

a light source;

illuminating means for projecting first and second light beams from said light source, having different directions of polarization, onto the diffraction grating;

signal detecting means for detecting an interference light signal from the diffraction grating, being based on a combination of diffraction light of the first light beam and diffraction light of the second light beam;

reference signal producing means for producing a reference signal;

phase difference detecting means for detecting a phase difference between the interference light signal and the reference signal; and determining means for determining the width of the line of the diffraction grating on the basis of the phase difference detected by said phase difference detecting means.

12. A system according to claim 11, wherein said reference signal producing means includes signal detecting means for detecting an interference light signal produced on the basis of a combination of the first and second light beams.

13. A deviation detecting method for detecting a relative positional deviation between first and second diffraction gratings, comprising:

a projecting step for projecting with illuminating means first and second light beams from a light source, having different directions of polarization, onto the first and second diffraction gratings along different directions;

a first signal detecting step for detecting a first interference light signal from the first diffraction grating, being based on a combination of diffraction light of the first light beam and diffraction light of the second light beam;

a second signal detecting step for detecting a second interference light signal from the second diffraction grating, being based on a combination of diffraction light of the first light beam and diffraction light of the second light beam;

a first phase difference detecting step for detecting a phase difference between the first and second interference light signals;

a second phase difference detecting step for producing third and fourth interference light signals for correction of a phase error involved in the detected phase difference, and for detecting a phase difference between the third and fourth interference light signals, the phase error being produced by the first and second diffraction gratings which differ with respect to their affect on the phase of light reflected therefrom in dependence upon the state of polarization of light impinging thereon; and a determining step for determining the relative positional deviation between the first and second diffraction gratings on the basis of a phase difference as detected by said first and second phase difference detecting steps.

14. A method according to claim 13, wherein the first and second light beams have wavelengths different from each other.

15. A method according to claim 13, wherein the first and second diffraction gratings are provided on a substrate, and wherein the substrate is rotated by 180 degrees relative to the illuminating means and then the illuminating means projects the first and second light beams upon the substrate such that diffraction light of the first light beam and diffraction light of the second light beam, both from the first diffraction grating, are combined with each other to produce the third interference light signal, while diffraction light of the first light beam and diffraction light of the second light beam, both from the second diffraction grating, are combined with each other to produce the fourth interference light signal.

16. A method according to claim 13, wherein said projecting step includes a polarization reversing step for mutually reversing the directions of polarization of the first and second light beams to provide third and fourth light beams, respectively, and wherein the third and fourth light beams are projected on the first and second diffraction gratings such that diffraction light of the third light beam and diffraction light of the fourth light beam both from the first diffraction grating are combined with each other to produce the third interference light signal, while diffraction light of the third light beam and diffraction light of the fourth light beam both from the second diffraction grating are combined with each other to produce the fourth interference light signal.

17. A method according to claim 16, wherein in said polarization reversing step the polarization is reversed in a time series.

18. A method according to claim 17, wherein a polarization modulation laser is used as the light source.

19. A method according to claim 13, wherein determining step includes an adding step for adding the phase differences to each other as detected by said first and second phase difference detecting steps.

20. A method according to claim 13, wherein said illuminating step includes an interchanging step for interchanging the first and second light beams to produce third and fourth light beams, respectively, and wherein the third and fourth light beams are projected upon the first and second diffraction gratings such that diffraction light of the third light beam and diffraction light of the fourth light beam, both from the first diffraction grating, are combined with each other to produce the third interference light signal, while diffraction light of the third light beam and diffraction light of the fourth light beam, both from the second diffraction grating, are combined with each other to produce the fourth interference light signal.

21. A method according to claim 13, further comprising projecting third light having the same direction of polarization as the first light and fourth light having the same direction of polarization as the second light, upon the first and second diffraction gratings along the direction of incidence of the first light beam, wherein diffraction light of the third light beam and diffraction light of the fourth light beam both from the first diffraction grating are combined with each other to produce the third interference light signal, while diffraction light of the third light beam and diffraction light of the fourth light beam both from the second diffraction grating are combined with each other to produce the fourth interference light signal.

22. A method of measuring the width of a line constituting a diffraction grating, comprising:

an illuminating step for projecting first and second light beams from a light source, having different directions of polarization, onto the diffraction grating along different directions;

a signal detecting step for detecting an interference light signal from the diffraction grating, being based on a combination of diffraction light of the first light beam and diffraction light of the second light beam;

a reference signal producing step for producing a reference signal;

a phase difference detecting step for detecting a phase difference between the interference light signal and the reference signal; and a determining step for determining the width of the line of the diffraction grating on the basis of the phase difference detected by said phase difference detecting step.

23. A method according to claim 22, wherein said reference signal producing step includes a signal detecting step for detecting an interference light signal produced on the basis of a combination of the first and second light beams.

24. A method according to claim 22, further comprising a relation determining step for determining the relationship between the phase difference and the line width beforehand.

* * * * *

UNITED STATES PATENT AND TRADEMARK OFFICE
CERTIFICATE OF CORRECTION

PATENT NO. : 5,625,453
DATED : April 29, 1997
INVENTOR(S) : TAKAHIRO MATSUMOTO et al.

It is certified that error appears in the above-identified patent and that said Letters Patent is hereby corrected as shown below:

ON COVER PAGE:

At [57] Under "ABSTRACT":
Line 16, "signals and" should read --signals, and--.

SHEET 23 OF 23
Figure 28, "VALUS" should read --VALUES--.

COLUMN 2:
Line 24, "that:" should read --that--.

COLUMN 3:
Line 56, "invention light" should read --invention,--.
Line 57, "beams," should be deleted and "lights" should read --light beams--.
Line 63, "beam" should read --beams--.

COLUMN 4:
Line 7, "beam" should read --beams--.
Line 8, "beam" should read --beams--.
Line 9, "beam" should read --beams--.

COLUMN 6:
Line 25, "elevation" should read --evaluation--.

COLUMN 7:
Line 21, "15" should read --15a--.
Line 22, "a" should be deleted--.
Line 26, "advances" should read --advance--.

UNITED STATES PATENT AND TRADEMARK OFFICE
CERTIFICATE OF CORRECTION

PATENT NO. : 5,625,453
DATED : April 29, 1997
INVENTOR(S) : TAKAHIRO MATSUMOTO et al.

It is certified that error appears in the above-identified patent and that said Letters Patent is hereby corrected as shown below:

<u>COLUMN 9</u>:
Line 45, ""{"and"}")" should read --"{" and "}")--.

<u>COLUMN 10</u>:
Line 50, "change" should read --changed--.

<u>COLUMN 19</u>:
Line 10, "beam." should read --beams.--.

<u>COLUMN 20</u>:
Line 28, "beam" should read --beams--.
Line 32, "into" should read --in--.

<u>COLUMN 21</u>:
Line 43, "diffraction" should read --difference--.

<u>COLUMN 23</u>:
Line 60, "lien width" should read --line width--.

Signed and Sealed this

Sixth Day of January, 1998

Attest:

Attesting Officer

BRUCE LEHMAN
Commissioner of Patents and Trademarks